United States Patent
Yamae et al.

(10) Patent No.: US 9,871,226 B2
(45) Date of Patent: Jan. 16, 2018

(54) ORGANIC ELECTROLUMINESCENT ELEMENT, ILLUMINATION DEVICE, AND DISPLAY DEVICE

(71) Applicant: PANASONIC INTELLECTUAL PROPERTY MANAGEMENT CO., LTD., Osaka (JP)

(72) Inventors: Kazuyuki Yamae, Nara (JP); Yasuhisa Inada, Osaka (JP); Akira Hashiya, Osaka (JP)

(73) Assignee: PANASONIC INTELLECTUAL PROPERTY MANAGEMENT CO., LTD., Osaka (JP)

( * ) Notice: Subject to any disclaimer, the term of this patent is extended or adjusted under 35 U.S.C. 154(b) by 0 days.

(21) Appl. No.: 15/036,145

(22) PCT Filed: Oct. 9, 2014

(86) PCT No.: PCT/JP2014/005141
§ 371 (c)(1),
(2) Date: May 12, 2016

(87) PCT Pub. No.: WO2015/072070
PCT Pub. Date: May 21, 2015

(65) Prior Publication Data
US 2016/0293892 A1 Oct. 6, 2016

(30) Foreign Application Priority Data
Nov. 13, 2013 (JP) .................................. 2013-234602

(51) Int. Cl.
*H01L 51/52* (2006.01)
*H01L 51/50* (2006.01)
*H01L 51/00* (2006.01)

(52) U.S. Cl.
CPC ...... *H01L 51/5268* (2013.01); *H01L 51/5056* (2013.01); *H01L 51/5072* (2013.01);
(Continued)

(58) Field of Classification Search
CPC ............. H01L 51/5268; H01L 51/5056; H01L 51/5072; H01L 51/5088; H01L 51/5092; H01L 51/5275; H01L 51/5293
See application file for complete search history.

(56) References Cited

U.S. PATENT DOCUMENTS

| | | | |
|---|---|---|---|
| 5,928,801 | A | 7/1999 | Broer et al. |
| 9,012,902 | B2 | 4/2015 | Ide et al. |

(Continued)

FOREIGN PATENT DOCUMENTS

| | | |
|---|---|---|
| JP | 10-510671 | 10/1998 |
| JP | 11-102783 | 4/1999 |

(Continued)

OTHER PUBLICATIONS

Kim et al., "Organic Light-Emitting Diodes with 30% External Quantum Efficiency Based on a Horizontally Oriented Emitter", Advanced Functional Materials, 2013, pp. 1-5.

*Primary Examiner* — Alonzo Chambliss
(74) *Attorney, Agent, or Firm* — Greenblum & Bernstein, P.L.C.

(57) ABSTRACT

This organic electroluminescent element includes: a light transmissive substrate; a light emitting stack including a first electrode, a light emitting layer, and a second electrode; and at least one light-outcoupling structure which has an uneven structure. The light emitting layer has a birefringence property with a higher refractive index in a direction parallel to a surface of the light transmissive substrate than a refractive index in a direction perpendicular to the surface of the light transmissive substrate. The uneven structure includes a (Continued)

plurality of protrusions which are individually allocated to some of planar matrix-like sections, and with regard to unit regions consisting of same number of sections of the planar matrix-like sections, a ratio of an area of one or more of the plurality of protrusions in a unit region is substantially constant in each unit region.

13 Claims, 22 Drawing Sheets

(52) U.S. Cl.
CPC ...... *H01L 51/5088* (2013.01); *H01L 51/5092* (2013.01); *H01L 51/5275* (2013.01); *H01L 51/5293* (2013.01); *H01L 51/0037* (2013.01)

(56) References Cited

U.S. PATENT DOCUMENTS

| | | | |
|---|---|---|---|
| 9,105,873 B2 | 8/2015 | Tsuji et al. | |
| 9,214,649 B2* | 12/2015 | Inada | H01L 51/5262 |
| 9,577,206 B2* | 2/2017 | Yamae | H01L 51/5004 |
| 2002/0061418 A1 | 5/2002 | Imanishi | |
| 2004/0135494 A1 | 7/2004 | Miyatake | |
| 2005/0089720 A1 | 4/2005 | Imanishi | |
| 2012/0286258 A1* | 11/2012 | Naraoka | C09K 11/06 257/40 |
| 2013/0015486 A1 | 1/2013 | Sekine et al. | |
| 2014/0001448 A1* | 1/2014 | Naraoka | H01L 51/5275 257/40 |
| 2014/0191226 A1* | 7/2014 | Yamae | H01L 51/5036 257/40 |
| 2016/0111475 A1 | 4/2016 | Ohara et al. | |

FOREIGN PATENT DOCUMENTS

| | | |
|---|---|---|
| JP | 2002-110363 | 4/2002 |
| JP | 2004-205953 | 7/2004 |
| JP | 2006-244768 | 9/2006 |
| JP | 2007-041087 | 2/2007 |
| JP | 2009-021408 | 1/2009 |
| JP | 2013-012500 | 1/2013 |
| JP | 2013-191314 | 9/2013 |
| WO | 97/12276 | 4/1997 |
| WO | 2011/125390 | 10/2011 |
| WO | 2013/088904 | 6/2013 |
| WO | 2013/137184 | 9/2013 |

* cited by examiner

ORGANIC ELECTROLUMINESCENT ELEMENT, ILLUMINATION DEVICE, AND DISPLAY DEVICE

TECHNICAL FIELD

Organic electroluminescent elements, illumination devices using same, and display devices using same are disclosed. More particularly, organic electroluminescent elements including at least one light-outcoupling structure are disclosed.

BACKGROUND ART

In a generally known structure of an organic electroluminescent element (hereinafter referred to as "organic EL element"), a light emitting stack including an anode, a hole transport layer, a light emitting layer, an electron injection layer, and a cathode are stacked on a surface of a substrate which is light transmissive. In such organic EL element, light is produced in the light emitting layer when voltage is applied between the anode and the cathode, and produced light is extracted outside through the electrode and the substrate which are light transmissive.

Generally, light-outcoupling efficiency is about 20 to 30% in an organic EL element, meaning that light which cannot effectively contribute to light emission takes up 70 to 80% of a total amount of the produced light. The reason for this is that light cannot be effectively propagated outside where light is perceived, due to total reflection at an interface between materials with different refractive indices, absorption of light by a material, and the like. Consequently, there is a quite high expectation for improving efficiency in an organic EL element by improving the light-outcoupling efficiency.

There have been a quite large number of attempts to improve the light-outcoupling efficiency. Especially among those attempts, a large number of efforts have been made to increase an amount of light reaching the substrate from an organic layer.

Since the organic layer generally has a refractive index higher than or equal to about 1.7, and glass, which often serves as the substrate, has a refractive index of about 1.5, loss of light due to total reflection (a thin film waveguide mode) at an interface between the organic layer and the glass reaches up to about 50% of the total amount of the produced light. Reducing the loss of light due to total reflection between the organic layer and the substrate will make it possible to greatly improve the light-outcoupling efficiency of the organic EL element.

In order to reduce the loss of light due to total reflection, a method employing principles of dipoles has been developed recently (for example, see S.-Y. Kim et al., "Organic Light-Emitting Diodes with 30% External Quantum Efficiency Based on a Horizontally Oriented Emitter," Adv. Funct. Mater. 2013, DOI: 10.1002/adfm.201300104, 2013). In this method, light-outcoupling efficiency is improved by orienting dipoles.

However, even in the organic EL element employing methods such as the above disclosed in the literature, it can hardly be said that the light-outcoupling efficiency is sufficiently improved, and thus a structure which can improve the light-outcoupling efficiency even further is in demand.

SUMMARY OF INVENTION

The present disclosure aims to provide an organic EL element, an illumination device, and a display device which have high light-outcoupling efficiency.

An organic electroluminescent element is disclosed. The organic electroluminescent element includes: a light transmissive substrate; a light emitting stack including a first electrode being light transmissive, a light emitting layer, and a second electrode which are arranged in this order from the light transmissive substrate; and at least one light-outcoupling structure which has an uneven structure. The light emitting layer has a birefringence property which exhibits a higher refractive index in a direction parallel to a surface of the light transmissive substrate than a refractive index in a direction perpendicular to the surface of the light transmissive substrate. The at least one light-outcoupling structure is provided closer to a light-outcoupling side, defined as an opposite side of the first electrode from the light emitting layer, than the first electrode. The uneven structure includes a plurality of protrusions having substantially same heights which are individually allocated to some of planar matrix-like sections so that the planar matrix-like sections become uneven, and with regard to unit regions consisting of same number of sections of the planar matrix-like sections, a ratio of an area of one or more of the plurality of protrusions in a unit region to a total area of the unit region is substantially constant in each unit region.

An illumination device is disclosed. The illumination device includes the above organic electroluminescent element and a wiring.

A display device is disclosed. The display device includes the above organic electroluminescent element and a wiring.

In the organic electroluminescent element of the present disclosure, since the light emitting layer has the birefringence property and the at least one light-outcoupling structure is provided closer to the light-outcoupling side than the first electrode, more of light from the light emitting layer can be extracted outside. As a result, the organic electroluminescent element, the illumination device, and the display device which have the high light-outcoupling efficiency and an excellent light emitting property can be obtained.

BRIEF DESCRIPTION OF DRAWINGS

FIG. 3A illustrates a case where the direction of vibration is horizontal, and FIG. 3B illustrates a case where the direction of vibration is vertical.

FIG. 4A illustrates a case where the direction of vibration is horizontal, and FIG. 4B illustrates a case where the direction of vibration is vertical.

FIG. 5A illustrates a case where the direction of vibration is horizontal, and FIG. 5B illustrates a case where the direction of vibration is vertical.

FIG. 6A illustrates a case where the direction of vibration is horizontal, and FIG. 6B illustrates a case where the direction of vibration is vertical.

FIG. 7A illustrates a case where the direction of vibration is horizontal, and FIG. 7B illustrates a case where the direction of vibration is vertical.

FIG. 9A illustrates a case where a direction of vibration is random, FIG. 9B illustrates a case where the direction of vibration is vertical, and FIG. 9C illustrates a case where the direction of vibration is horizontal.

FIG. 10A illustrates a case where a direction of vibration is random, FIG. 10B illustrates a case where the direction of vibration is vertical, and FIG. 10C illustrates a case where the direction of vibration is horizontal.

FIG. 11A is a plan view, and FIG. 11B is a cross-sectional view.

FIG. 17A illustrates a light-outcoupling structure having an uneven structure, FIG. 17B illustrates a micro-lens array structure, FIG. 17C illustrates a micro-pyramid array structure, FIG. 17D illustrates a scattering structure, and FIG. 17E illustrates a mirror surface structure.

FIG. 24A illustrates light traveling perpendicular to the medium. FIG. 24B illustrates light traveling obliquely against the medium at a relatively small incident angle. FIG. 24C illustrates light traveling obliquely against the medium at a relatively large incident angle.

DESCRIPTION OF EMBODIMENTS

Figure 1:
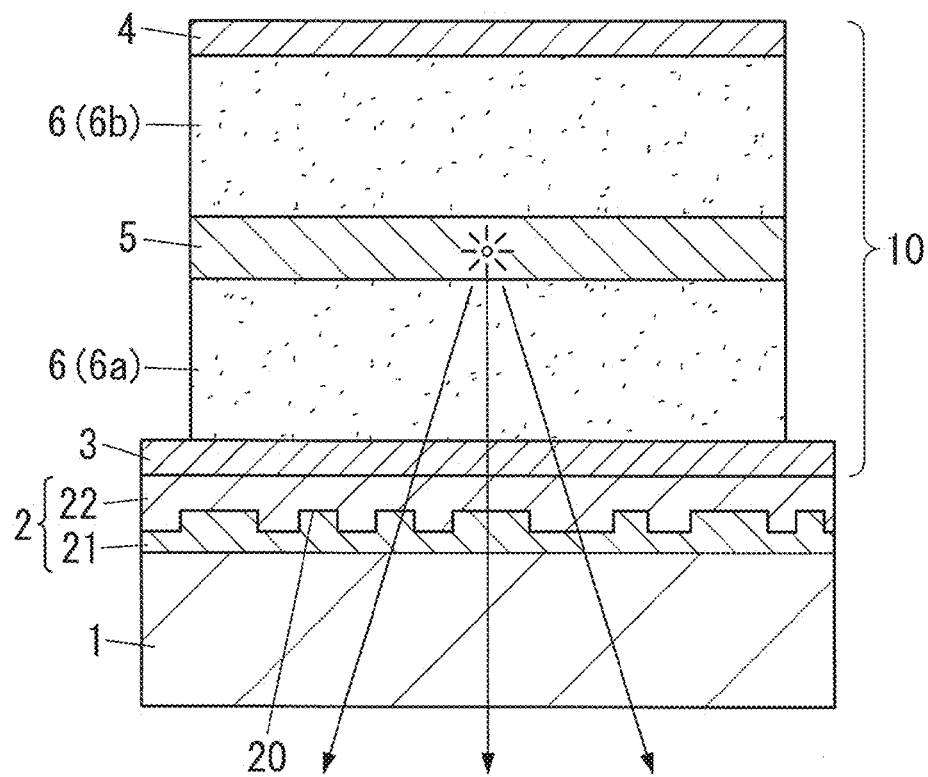
FIG. 1 is a schematic view illustrating an example of a layering structure of an organic electroluminescent element.

An organic electroluminescent element (organic EL element) is disclosed. The organic electroluminescent element includes: a light transmissive substrate 1; a light emitting stack 10 including a first electrode 3 being light transmissive, a light emitting layer 5, and a second electrode 4 which are arranged in this order from the light transmissive substrate 1; and at least one light-outcoupling structure 2 which has an uneven structure 20. The light emitting layer 5 has a birefringence property which exhibits a higher refractive index in a direction parallel to a surface of the light transmissive substrate 1 than a refractive index in a direction perpendicular to the surface of the light transmissive substrate 1. The at least one light-outcoupling structure 2 is provided closer to a light-outcoupling side, defined as an opposite side of the first electrode 3 from the light emitting layer 5, than the first electrode 3. The uneven structure 20 includes a plurality of protrusions having substantially same heights which are individually allocated to some of planar matrix-like sections so that the planar matrix-like sections become uneven. With regard to unit regions consisting of same number of sections of the planar matrix-like sections, a ratio of an area of one or more of the plurality of protrusions in a unit region to a total area of the unit region is substantially constant in each unit region.

In the organic EL element, since the light emitting layer 5 has the birefringence property, the light emitting layer 5 can emit more light traveling at low angles. Furthermore, since the light emitting layer 5 has the birefringence property, an influence by plasmon can be suppressed, leading to more light emission to outside. In addition, since light emitted from the light emitting layer 5 having the birefringence property is extracted by the above at least one light-outcoupling structure which can easily extract light traveling at low angles, light-outcoupling efficiency is enhanced. As a result, the organic EL element which has the high light-outcoupling efficiency and an excellent light emitting property can be obtained. The organic EL element is further explained hereinafter.

[Birefringence Property]

FIG. 1 illustrates an example of the organic EL element. The organic EL element includes the light transmissive substrate 1, the light emitting stack 10, and the at least one light-outcoupling structure 2. The light emitting stack 10 includes the first electrode 3, the light emitting layer 5, and the second electrode 4. The first electrode 3 is light transmissive. The first electrode 3, the light emitting layer 5, and the second electrode 4 are arranged in this order from the light transmissive substrate 1. The at least one light-outcoupling structure 2 has the uneven structure 20. The light transmissive substrate 1 serves as a substrate supporting the light emitting stack 10. In this organic EL element, the light-outcoupling side is a side close to the substrate. The organic EL element has a so-called bottom-emission structure. In the bottom-emission structure, light is extracted outside from the supporting substrate. The at least one light-outcoupling structure 2 is provided closer to the light-outcoupling side than the first electrode 3. In the embodiment illustrated in FIG. 1, the at least one light-outcoupling structure 2 is provided between the first electrode 3 and the light transmissive substrate 1. The at least one light-outcoupling structure 2 is formed on the surface of the light transmissive substrate 1. In FIG. 1, light emission from a light emitting point is illustrated with an arrow.

The first electrode 3 and the second electrode 4 are a pair of electrodes. One of the first electrode 3 and the second electrode 4 serves as an anode, and the other serves as a cathode. In a preferable embodiment, the first electrode 3 is formed as an anode and the second electrode 4 is formed as a cathode. As a matter of course, the first electrode 3 may be formed as a cathode and the second electrode 4 may be formed as an anode.

The second electrode 4 preferably has light reflectivity. When the second electrode 4 preferably has light reflectivity, light emitted from the light emitting layer 5 can be reflected and transformed into light traveling towards the light transmissive substrate 1, and thus the light-outcoupling efficiency can be enhanced. In this case, the second electrode 4 is formed as a reflective electrode. The reflective electrode can function as a reflective layer which reflects light.

The organic EL element illustrated in FIG. 1 includes a charge transfer layer 6 between the light emitting layer 5 and each electrode. The charge transfer layer 6 transfers charges (electrons or positive holes) to the light emitting layer 5. The charge transfer layer 6 is classified into a charge transfer layer 6 provided between the light emitting layer 5 and the anode and a charge transfer layer 6 provided between the light emitting layer 5 and the cathode. Examples of the charge transfer layer 6 provided between the light emitting layer 5 and the anode include a hole transport layer and a hole injection layer. Examples of the charge transfer layer 6 provided between the light emitting layer 5 and the cathode include an electron transport layer and an electron injection layer. The charge transfer layer 6 between the first electrode 3 and the light emitting layer 5 is defined as a first charge transfer layer 6a. The charge transfer layer 6 between the second electrode 4 and the light emitting layer 5 is defined as a second charge transfer layer 6b. When the first electrode 3 is the anode, the first charge transfer layer 6a may include either one or both of the hole injection layer and the hole transport layer. When the second electrode 4 is the cathode, the second charge transfer layer 6b may include either one or both of the electron injection layer and the electron transport layer.

The light emitting layer 5 has the birefringence property. The birefringence property is a structure having an anisotropic refractive index. In the organic EL element, the refractive index of the light emitting layer 5 in the direction parallel to the surface of the light transmissive substrate 1 is larger than the refractive index of the light emitting layer 5 in the direction perpendicular to the surface of the light transmissive substrate 1. The direction parallel to the surface of the light transmissive substrate 1 is same as a direction parallel to a light emitting surface of the organic EL element. This direction may be referred to as a surface direction of the organic EL element. This direction may be referred to as an expanding direction of layers of the light emitting stack 10.

The surface direction may be two-dimensional. The direction perpendicular to the surface of the light transmissive substrate 1 is same as a thickness direction of the organic EL element. This direction may be referred to as a stack direction of the light emitting stack 10. The stack direction is one-dimensional. The direction parallel to the surface of the light transmissive substrate 1 and the direction perpendicular to the surface of the light transmissive substrate 1 are orthogonal to each other.

Since the light emitting layer 5 has the birefringence property, more light generated in the light emitting layer 5 can travel towards the light transmissive substrate 1. Accordingly, the light-outcoupling efficiency can be improved.

Figure 2:
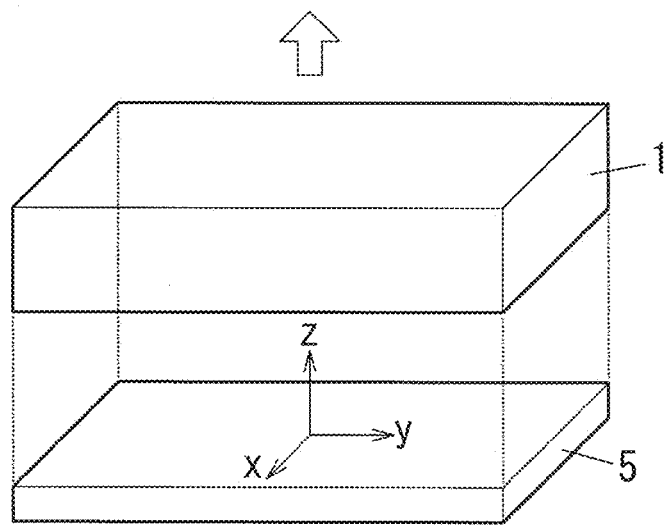
FIG. 2 is a three-dimensional conceptual diagram to explain an organic electroluminescent element.

FIG. 2 is a three-dimensional conceptual diagram to explain the organic electroluminescent element. Space coordinates are explained using FIG. 2. FIG. 2 illustrates the light emitting layer 5 and the light transmissive substrate 1 of the organic EL element. In FIG. 2, an arrangement of the layers is illustrated upside down compared to FIG. 1. That is, a direction of light emission is illustrated upward. It should be understood that FIG. 2 explains the organic EL element illustrated in FIG. 1. In FIG. 2, emission of light is illustrated with an outlined arrow.

A direction of traveling light is considered using a three-dimensional coordinate system of xyz illustrated in FIG. 2. In the three-dimensional coordinate system, an x-axis, a y-axis, and a z-axis are orthogonal to each other. The x-axis, the y-axis, and the z-axis are straight lines. Assume that the center of the three-dimensional coordinate system is the light emitting point. The light emitting point is a point where light is generated in the light emitting layer 5. The light emitting point may also be referred to as the center of vibration of light emitting molecules. The z-axis is defined as an axis extending along the direction perpendicular to the surface of the light transmissive substrate 1. The z-axis is a straight line extending in the thickness direction. A z-axis direction is defined as a direction from the light emitting layer 5 to the light transmissive substrate 1. The x-axis and the y-axis are defined as axes extending along the direction parallel to the surface of the light transmissive substrate 1. The x-axis and the y-axis can be said to be along the surface direction (the expanding direction of the layers). The x-axis and the y-axis form an xy plane. The xy plane is a plane parallel to the surface of the light transmissive substrate 1. The xy plane can be said to be a plane parallel to a surface of the light emitting layer 5. The z-axis direction and an opposite direction of the z-axis direction are defined as a vertical direction. The surface direction of the xy plane is defines as a horizontal direction.

The birefringence property in the light emitting layer 5 can also be expressed as a property in which a refractive index in a direction parallel to the xy plane is larger than a refractive index in the z-axis direction. Using n as a notation for a refractive index, the refractive index in the direction parallel to the xy plane can be noted as $n_{xy}$. The refractive index in the z-axis direction can be noted as $n_z$. Thus, the birefringence property in the light emitting layer 5 can be expressed as $n_{xy} > n_z$.

In the light emitting layer 5, the refractive index $n_{xy}$ of the light emitting layer 5 in the direction parallel to the surface of the light transmissive substrate 1 may be, for example, within a range of 1.6 to 2.2. The refractive index $n_z$ of the light emitting layer 5 in the direction perpendicular to the surface of the light transmissive substrate 1 may be, for example, within a range of 1.5 to 2.0. When designing a light-outcoupling structure for the organic EL element, the refractive index $n_z$ of the light emitting layer 5 in the direction perpendicular to the surface of the light transmissive substrate 1 (the thickness direction) may generally be used as a refractive index of the light emitting layer 5, since light traveling in the thickness direction largely contributes to light emission to outside. A difference between the refractive index $n_{xy}$ of the light emitting layer 5 in the direction parallel to the surface of the light transmissive substrate 1 and the refractive index $n_z$ of the light emitting layer 5 in the direction perpendicular to the surface of the light transmissive substrate 1 is preferably larger than or equal to 0.1, more preferably larger than or equal to 0.2, and further preferably larger than or equal to 0.3. The larger the difference in the refractive indices becomes, the more the light-outcoupling efficiency is enhanced. A maximum difference between the refractive index $n_{xy}$ of the light emitting layer 5 in the direction parallel to the surface of the light transmissive substrate 1 and the refractive index $n_z$ of the light emitting layer 5 in the direction perpendicular to the surface of the light transmissive substrate 1 is not particularly limited, but the difference in the refractive indices may be less than or equal to 0.5 in terms of easiness in manufacturing. The refractive indices of the light emitting layer 5 may be values measured with spectroscopic ellipsometry. As a measuring device, a spectroscopic ellipsometer and the like may be used.

The birefringence property in the light emitting layer 5 can be realized with orientation of the light emitting molecules. The light emitting molecules (also simply referred to as "molecules") preferably have a structure of dipoles. In this case, the light emitting molecules are assumed as dipoles. The dipoles are electric dipoles. Controlling a direction of dipole vibration in the light emitting molecules leads to the birefringence property. The light emitting molecules may be so-called dopants.

In a molecular orientation film including the oriented molecules having the structure of dipoles, an arrangement structure of the molecules is anisotropic. Since the arrangement structure of the molecules is anisotropic, a film including those molecules exhibits anisotropic refractivities. Note that, when the direction of dipole vibration is horizontal and the molecules are horizontally oriented, the refractive index $n_{xy}$ in the horizontal direction tends to be larger than the refractive index $n_z$ in the vertical direction. The refractive index tends to be larger in a direction in which molecules are oriented. As described above, formation of the light emitting layer 5 having oriented molecules enhances the light-outcoupling efficiency.

Figure 3A:
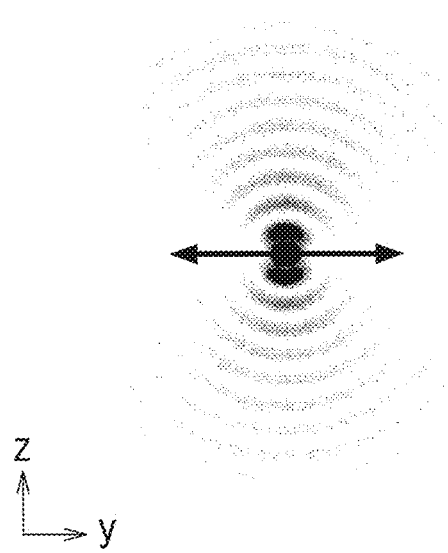
FIG. 3A and FIG. 3B are explanatory views (conceptual diagrams) illustrating a relationship between a direction of dipole vibration and orientation of emitted light.
Figure 3B:
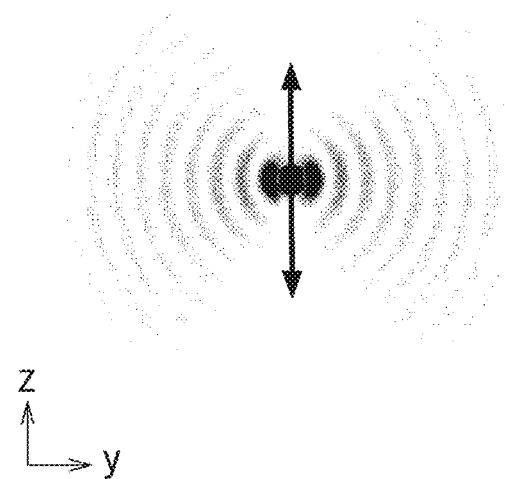

FIG. 3A and FIG. 3B are conceptual diagrams illustrating a relationship between the direction of dipole (electric dipole) vibration and the orientation of emitted light. FIG. 3A and FIG. 3B illustrate the dipoles from a side of the organic EL element along the horizontal direction. The dipole vibration is illustrated with a bidirectional arrow. The center of the bidirectional arrow is the center of vibration. FIG. 3A illustrates a relationship between horizontally oriented dipole vibration and orientation of the emitted light. In FIG. 3A, the molecules are horizontally oriented. Horizontal orientation means that the direction of dipole vibration is horizontally oriented. FIG. 3B illustrates a relationship between vertically oriented dipole vibration and orientation of the emitted light. In FIG. 3B, the molecules are vertically oriented. Vertical orientation means that the direction of dipole vibration is vertically oriented. In FIG. 3A and FIG. 3B, the arrows indicate the direction of vibration. In FIG. 3A and FIG. 3B, circles drawn radially with color shades indicate diffused light. In these circles, a region with a large amount of light is drawn with a dark shade of color and a region with a small amount of light is drawn with a light shade of color.

In FIG. 3A and FIG. 3B, light is not diffused uniformly, and light is oriented in certain directions. Light being oriented means that the direction of vibration of light emitted from the dipoles generated in the light emitting layer 5 exists unevenly in the horizontal direction or the vertical direction. In an ordinary organic EL element in which dipoles are not oriented, orientation of light disappears since light emission in a horizontal direction and a vertical direction appears randomly. Orientation in which light is not oriented is called as random orientation, for convenience sake. It is obvious that the random orientation has no orientation.

Considering light traveling along the vertical direction (light traveling towards the substrate), as illustrated in FIG. 3A, an amount of light traveling along the vertical direction (light traveling towards the substrate) in light emitted from the dipole vibrating in the horizontal direction is larger than an amount of light traveling along the vertical direction (light traveling towards the substrate) in light emitted from the dipole vibrating in the vertical direction illustrated in FIG. 3B. For example, a ratio of intensity of light in the vertical direction to intensity of light in the horizontal direction may be 2:1, 3:1, and the like. High intensity of light leads to a large amount of light. In this manner, the intensity of light changes depending on the orientation of the light emitting molecules (the dipoles). Due to the horizontally oriented dipole, the amount of light traveling towards the substrate increases, leading to further enhanced light-outcoupling efficiency. Note that, light traveling in the vertical direction includes light traveling towards the substrate and light traveling towards the opposite of the substrate. Light traveling towards the opposite of the substrate can be reversed by reflection and then transformed into the light traveling towards the substrate. Hence, a total amount of extracted light is larger in a case where the dipole is horizontally oriented and more emitted light in the vertical direction exists.

Figure 4A:
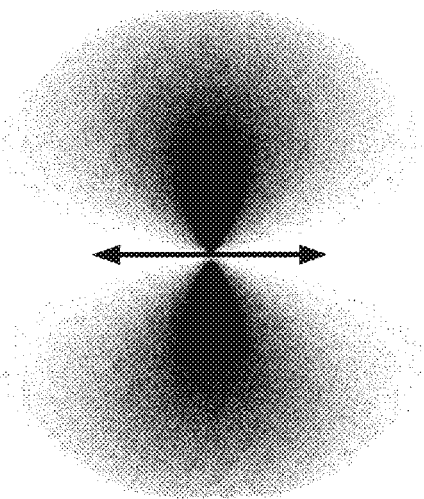
FIG. 4A and FIG. 4B are explanatory views (cross-sectional views) illustrating a relationship between a direction of dipole vibration and orientation of emitted light.
Figure 4B:
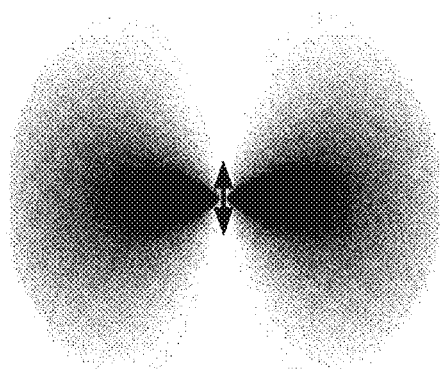

FIG. 4A and FIG. 4B are conceptual views illustrating a relationship between the direction of dipole vibration and the orientation of emitted light. FIG. 4A and FIG. 4B illustrate a case where the dipole is horizontally oriented, and FIG. 4B illustrates a case where the dipole is vertically oriented. The dipole vibration is illustrated with a bidirectional arrow. The center of the bidirectional arrow is the center of vibration. In FIG. 4A and FIG. 4B, the surface of the light transmissive substrate 1 is schematically illustrated as a substrate surface 1a. An actual distance between the dipole and the substrate surface 1a may be larger than as illustrated in the figure. In FIG. 4A and FIG. 4B, the amount of light is expressed by color shades. By comparing FIG. 4A and FIG. 4B, it is understood that an amount of light traveling towards the light transmissive substrate 1 is greater in FIG. 4A in which the dipole is horizontally oriented.

Figure 5A:
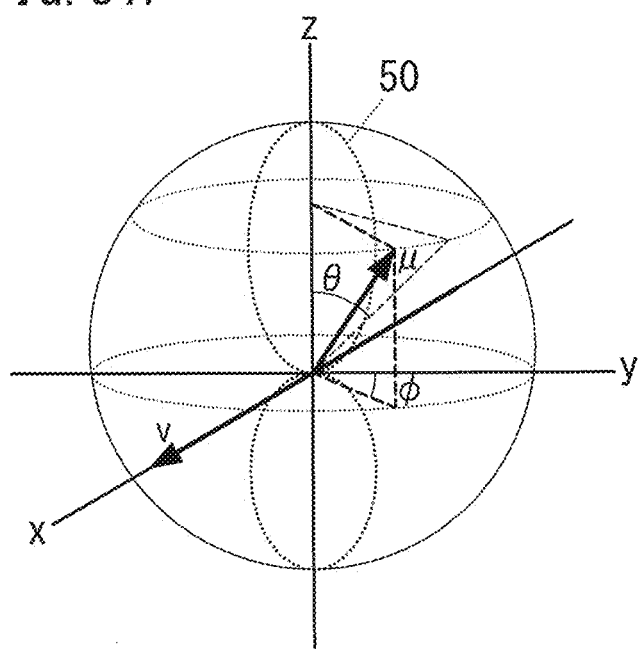
FIG. 5A and FIG. 5B are explanatory views (perspective views) illustrating a relationship between a direction of dipole vibration and orientation of emitted light.
Figure 5B:
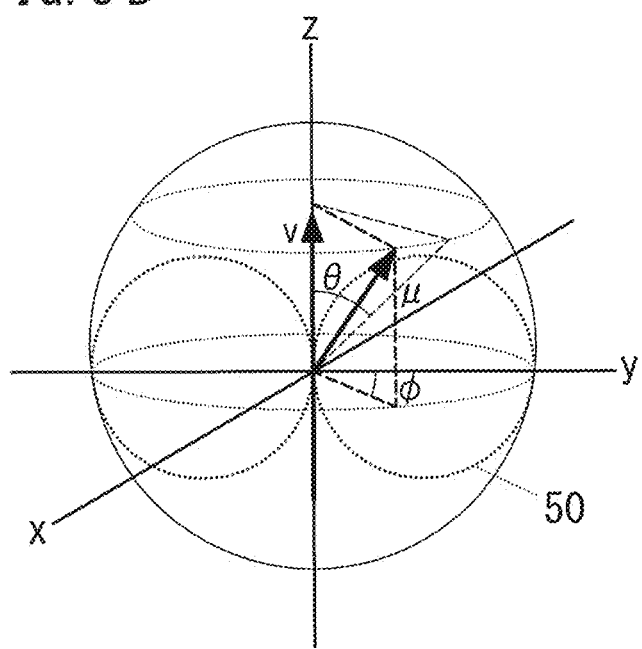

FIG. 5A and FIG. 5B are schematic diagrams three-dimensionally illustrating light emission patterns. FIG. 5A illustrates a case where the dipole is horizontally oriented, and FIG. 5B illustrates a case where the dipole is vertically oriented. In FIG. 5A and FIG. 5B, the directions of dipole vibration and the light emission patterns are illustrated in the xyz coordinate system.

In FIG. 5A and FIG. 5B, light emission is illustrated with a vector μ. The vector μ has an angle and a magnitude (intensity). The dipole vibration is illustrated with a vector v. An angle between the vector μ and the y-axis is expressed as φ. An angle between the vector μ and the z-axis is expressed as θ.

In FIG. 5A and FIG. 5B, the light emission patterns are illustrated with lines 50. In FIG. 5A, the direction of dipole vibration is in the x-axis direction. In this case, the light emission pattern is two ellipsoids with their major axes along the vertical direction or two spheres. In FIG. 5B, the direction of dipole vibration is in the z-axis direction. In this case, the light emission patterns are two spheres along the horizontal direction. The light emission pattern (the line 50) in FIG. 5A is advantageous in comparison to the light emission pattern (the line 50) in FIG. 5B.

Figure 6A:
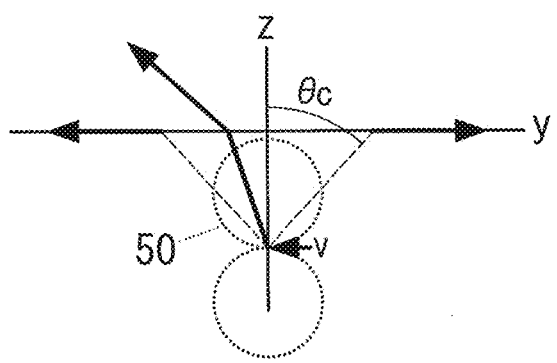
FIG. 6A and FIG. 6B are explanatory views (cross-sectional views) illustrating a relationship between a direction of dipole vibration and orientation of emitted light.
Figure 6B:
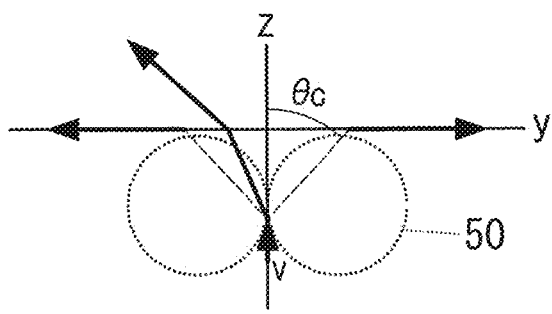

FIG. 6A and FIG. 6B are views illustrating the light emission patterns in FIG. 5A and FIG. 5B from the horizontal direction. FIG. 6A illustrates a case where the dipole is horizontally oriented and corresponds to FIG. 5A. FIG. 6B illustrates a case where the dipole is vertically oriented and corresponds to FIG. 5B. In FIG. 6A and FIG. 6B, the directions of dipole vibration and the light emission patterns in FIG. 5A and FIG. 5B are drawn as cross-sectional views on a yz plane. In FIG. 6A and FIG. 6B, refraction of light passing through an interface between media having different refractive indices is drawn. Light is illustrated with an arrow. The molecular vibration is illustrated with the vector v. A critical angle is illustrated with $\theta_c$. The light emission pattern is illustrated with the line 50. As illustrated in FIG. 6A and FIG. 6B, an amount of light with a lower angle than the critical angle $\theta_c$ tends to be larger in a case of FIG. 6A, compared to a case of FIG. 6B. In other words, an amount of emitted light tends to be larger in a case of FIG. 6A than in a case of FIG. 6B. Therefore, the light emission pattern of FIG. 6A is more advantageous in terms of the light-outcoupling efficiency.

Figure 7A:
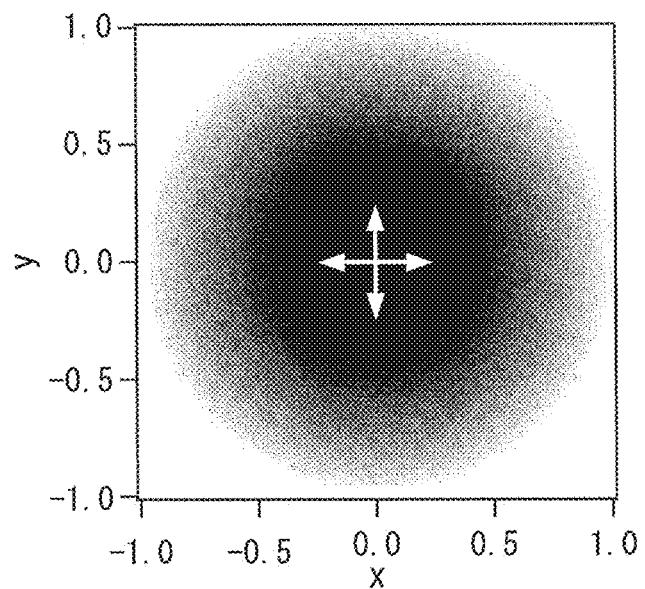
FIG. 7A and FIG. 7B are explanatory views (plan views) illustrating a relationship between a direction of dipole vibration and orientation of emitted light.
Figure 7B:
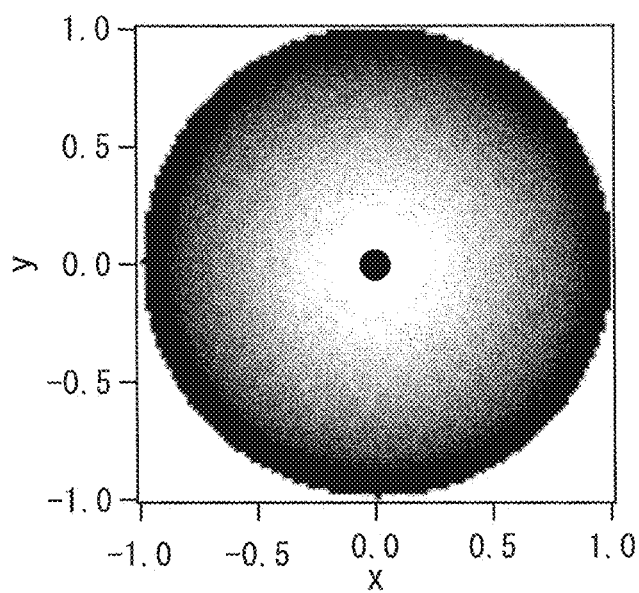

FIG. 7A and FIG. 7B are conceptual views illustrating a relationship between the direction of dipole vibration and the orientation of emitted light. FIG. 7A and FIG. 7B illustrate the orientation of emitted light in a plan view of the light emitting layer. The plan view means a view from a direction perpendicular to a surface of the substrate. FIG. 7A illustrates a case where the dipole is horizontally oriented and corresponds to FIG. 5A, and FIG. 7B illustrates a case where the dipole is vertically oriented and corresponds to FIG. 5B. In FIG. 7A and FIG. 7B, x and y correspond to the x-axis and the y-axis in the three-dimensional coordinate system. A position where x and y are 0 is the center of vibration. The amount of light is expressed with color shades. FIG. 7A and FIG. 7B can be said to be cross-sectional views on the xy plane. In FIG. 7A, the dipole vibration is illustrated with a white bidirectional arrow. In FIG. 7A, the white bidirectional arrow is used for easier understanding of the direction of vibration, but a region where the white bidirectional arrow is drawn is actually darker in black as indicated by the color shade of a region surrounding the white bidirectional arrow. In FIG. 7B, the dipole vibration is in a direction perpendicular to paper and illustrated with a black dot. In FIG. 7B, the black dot is used for easier understanding of the direction of vibration, but a region where the black dot is drawn is actually whiter as indicated by the color shade of a region surrounding the black dot.

In FIG. 7A, the dipole is horizontally oriented. In FIG. 7A, the direction of dipole vibration is illustrated with a bidirectional arrow with the x-axis or the y-axis, but the direction of dipole vibration not only is along the x-axis and the y-axis but also may be random on the xy plane. In a case of FIG. 7A, the color is darker in the center of the dipole, indicating more light in the center. The reason for this is, as explained in FIG. 4A, FIG. 5A, and FIG. 6A, that most of emitted light travels along the z-axis, leading to a larger amount of light in the center in a plan view. On the other hand, in a case of FIG. 7B, the color is lighter in the center of the dipole and the color is darker in a circular region surrounding the dipole. The reason for this is, as explained in FIG. 4B, FIG. 5B, and FIG. 6B, that emitted light travels along the xy plane, leading to a smaller amount of light in the center in a plan view. Also by comparing FIG. 7A and FIG. 7B, it should be understood that a case of FIG. 7A is more advantageous.

Next, a total radiant flux of light emitted from the light emitting layer which is extracted to the atmosphere is calculated using the above explained schematic diagrams of the light emission patterns.

Figure 8:
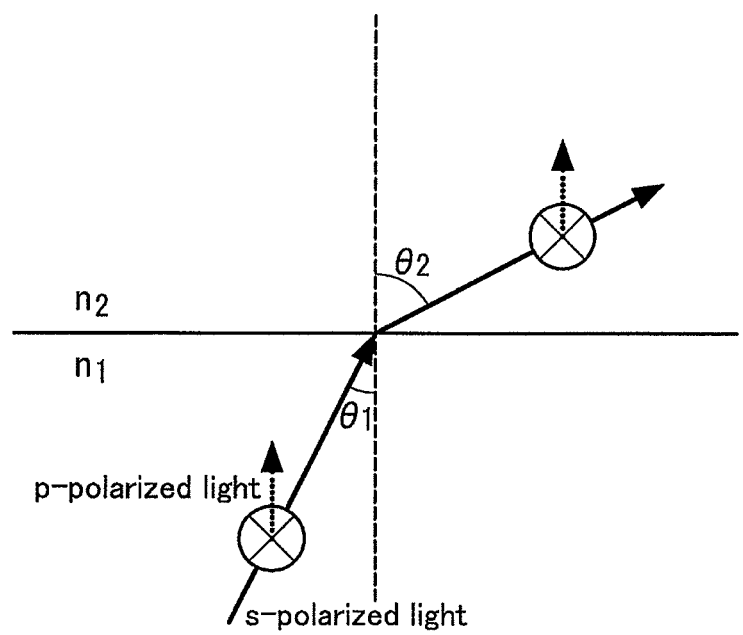
FIG. 8 is a schematic diagram to explain refraction of light passing through an interface (refractive index interface) between media having different refractive indices.

FIG. 8 is an explanatory view illustrating refraction of light passing through the interface between the media having the different refractive indices. Refraction and polarization of light are explained using a model illustrated in FIG. 8. When light travels from a medium with a refractive index $n_1$ to a medium with a refractive index $n_2$ at an incident angle $\theta_1$, refraction occurs at the interface between the medium with the refractive index $n_1$ and the medium with the refractive index $n_2$, and thus light travels towards an emission angle $\theta_2$. The interface between two media having the different refractive indices is defined as a refractive index interface. Note that, $\theta_1$ and $\theta_2$ are angles towards a direction perpendicular to the refractive index interface (the interface between two media). Light includes p-polarized light and s-polarized light. In FIG. 8, p-polarized light is illustrated with an arrow as light in the vertical direction, and s-polarized light is illustrated with x in a circle as light in the horizontal direction. The x in the circle indicates the direction perpendicular to paper. A radiant flux of p-polarized light $T_p$ and a radiant flux of s-polarized light $T_s$ can be expressed in the following formulas.

$$T_p = \frac{\sin 2\theta_1 \sin 2\theta_2}{\sin^2(\theta_1 + \theta_2)\cos^2(\theta_1 - \theta_2)} \qquad \text{[Mathematical 1]}$$

$$T_s = \frac{\sin 2\theta_1 \sin 2\theta_2}{\sin^2(\theta_1 + \theta_2)}$$

Note that, a relationship between the refractive indices and the angles of light traveling through the media having the different refractive indices is expressed in the following formula.

$$n_1 \sin \theta_1 = n_2 \sin \theta_2$$

Now consider the critical angle at which total reflection occurs. The critical angle is expressed as $\theta_c$. Therefore, $\theta_1 = \theta_c$. In this case, since the critical angle is an angle at which total reflection occurs, $\theta_2$ is 90°, and therefore $\theta_2 = \pi/2$ in a radian unit.

In addition, considering a refractive index of the atmosphere, since the refractive index of the atmosphere (air) is 1, $n_2 = 1$. Note that, there exist other layers between outside, which is the atmosphere, and the light emitting layer, but the above relationship is true for a relationship between the refractive indices and the angles with regard to the other layers. Therefore, when considering light extracted outside, it is sufficient to examine a difference in the refractive indices of the atmosphere and the light emitting layer.

From the above formula, $\sin \theta_c = 1/n_1$.

Taking these conditions into account, calculation is performed.

Table 1 shows formulas for calculation of the total radiant fluxes of light extracted to the atmosphere in each of the dipole orientation patterns. In this table, components of p-polarized light and s-polarized light are also shown. Light can be divided into p-polarized light and s-polarized light. The light-outcoupling efficiency can be further enhanced when p-polarized light and s-polarized light are taken into account. The refractive index of the atmosphere (air) is 1. Therefore, the total radiant flux of light extracted to the atmosphere is the total radiant flux of light extracted to a medium having a refractive index of 1. The total radiant flux of light extracted to the atmosphere is light emitted outside out of the entire light and thus means the light-outcoupling efficiency.

In Table 1, the angles $\theta$ and $\varphi$ are the angles explained in FIG. 5A and FIG. 5B. Also, $\mu$ is the magnitude of the vector $\mu$ explained in FIG. 5A and FIG. 5B. Further, $T_p$ is transmittance of p-polarized light, and $T_s$ is transmittance of s-polarized light. $E_p$ is a light intensity component of p-polarized light, and $E_s$ is a light intensity component of s-polarized light. In Table 1, $\theta_c$ is the critical angle.

TABLE 1

| Orientation | p-polarized component | s-polarized component | Total radian flux of light extracted to medium with refractive index n = 1 (light-outcoupling efficiency) |
|---|---|---|---|
| Horizontal orientation | $\mu \sin\varphi \cos\theta$ | $\mu \cos\varphi$ | $\int_0^{2\pi}\int_0^{\theta_c}(T_p(\theta)|E_p|^2 + T_s(\theta)|E_s|^2)\sin\theta d\theta d\varphi = \int_0^{2\pi}\int_0^{\theta_c}(T_p(\theta)\sin^2\varphi\cos^2\theta + T_s(\theta)\cos^2\varphi)\sin\theta d\theta d\varphi$ |
| Vertical orientation | $\mu \sin\theta$ | 0 | $\int_0^{2\pi}\int_0^{\theta_c}(T_p(\theta)|E_p|^2\sin\theta d\theta d\varphi = \int_0^{2\pi}\int_0^{\theta_c}(T_p(\theta)\sin^3\theta d\theta d\varphi$ |

TABLE 2

| Refractive index ($n_1$) | Random orientation | Vertical orientation | Horizontal orientation |
|---|---|---|---|
| 1.6 | 28.6% | 5.0% | 52.2% |
| 1.7 | 24.5% | 3.7% | 45.4% |
| 1.8 | 21.3% | 2.8% | 39.8% |

Based on the above conditions, the light-outcoupling effectiveness is simulated depending on the difference in orientation when the refractive indices are varied.

Table 2 shows the results. Table 2 shows the light-outcoupling efficiencies of a case where the dipole is randomly oriented, a case where the dipole is vertically oriented, and a case where the dipole is horizontally oriented. Table 2 shows the light-outcoupling efficiencies when light travels from the light emitting layer having the refractive index $n_1$ to air having the refractive index $n_2$=1. Note that, in Table 2, the refractive index $n_1$ of the light emitting layer is used as a refractive index of the entire organic layer. A refractive index of the substrate is ignored. These assumptions do not affect the element design, and a tendency of the structure which enhances the light-outcoupling efficiency can be determined.

As shown in Table 2, the light-outcoupling efficiency is lowered in the vertical orientation, considering the random orientation as standard. On the other hand, the light-outcoupling efficiency is increased in the horizontal orientation, compared to the random orientation. The reason for this is considered that, since light emitted from the molecules vibrating in the horizontal direction has relatively small incident angles towards the refractive index surface, light emitted to a region where total reflection does not occur increases in the horizontal orientation of the dipole compared to other orientations. Conversely, it is considered that, since light emitted from the molecules vibrating in the vertical direction tends to have large incident angles, total reflection occurs to most of light in the vertical orientation of the dipole at the refractive index surface, leading to lowered light-outcoupling efficiency. These results also show that the horizontal orientation of dipole vibration, i.e., the horizontal orientation of vibration of the light emitting molecules, is advantageous.

A structure having the horizontally oriented dipole is also advantageous in terms of suppressing plasmon loss of light. The plasmon loss is a phenomenon which light is lost at a surface of the reflective layer. Therefore, the structure is suitable in a case such as when an electrode at the opposite side of the light emitting layer from the light-outcoupling side is formed as the light reflective electrode and when a reflective layer is disposed at the opposite side of the light emitting layer from the light-outcoupling side. Light traveling towards the reflective layer may be lost, instead of reflected, by interacting with surface plasmon at an interface between the organic layer and the reflective layer. This phenomenon is prominent when the reflective layer is a metal layer. The loss of light caused by an interaction with plasmon may lead to a decrease in the light-outcoupling efficiency. In this regard, if the dipole is horizontally oriented, the interaction with the surface plasmon can be suppressed, leading to improvement in the light-outcoupling efficiency. The influence by plasmon can be determined by simulations and experiments.

Figure 9A:
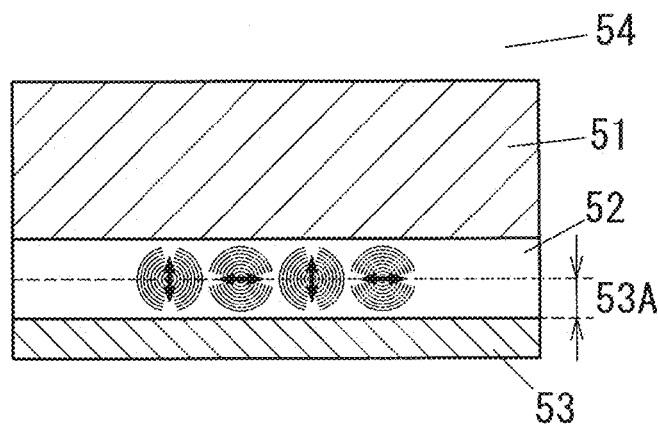
FIG. 9A, FIG. 9B and FIG. 9C are models illustrating a layering structure of an organic EL element which includes a light emitting layer having dipoles.
Figure 9B:
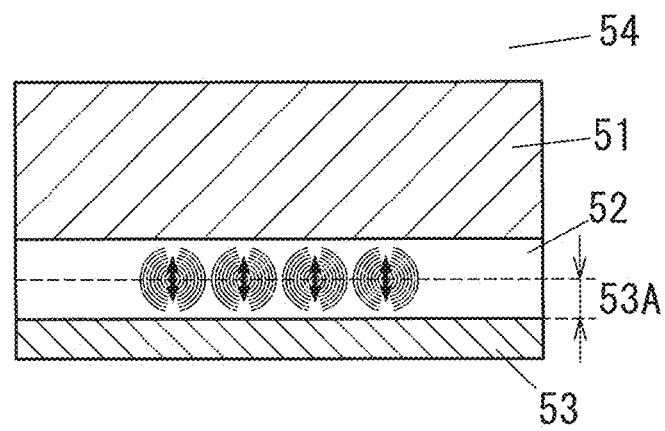
Figure 9C:
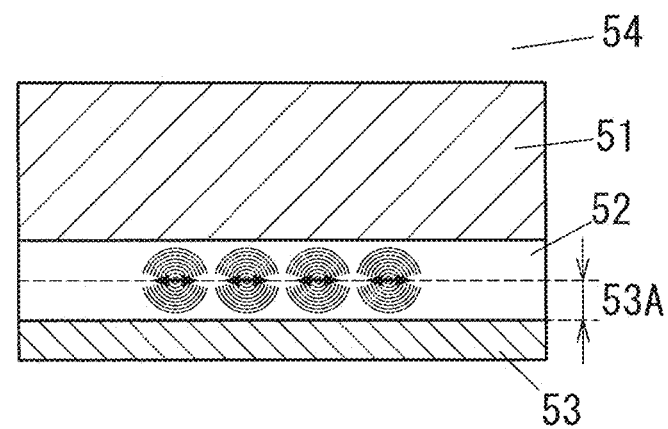

FIG. 9A, FIG. 9B and FIG. 9C are models illustrating the layering structure of the organic EL element. In FIG. 9A, FIG. 9B and FIG. 9C, a substrate 51, an organic layer 52, and a reflective layer 53 are stacked. Light is generated in the organic layer 52. Light is extracted outside 54 through the substrate 51. The reflective layer 53 may be formed as a reflective electrode. The reflective layer 53 may be formed as the second electrode 4 as described above. The first electrode 3 is omitted, but it should be considered that the first electrode 3 is included in the organic layer 52.

Distribution of light is calculated using the models illustrated in FIG. 9A, FIG. 9B and FIG. 9C. In FIG. 9A, FIG. 9B and FIG. 9C, assume the refractive index of the outside, the atmosphere (air), as 1, the refractive index of the substrate as 1.5, the refractive index of the organic layer as 1.8, and a refractive index of the reflective layer (the reflective electrode) as 0.13–i3.3. The refractive index of the substrate is selected based on an assumption that glass is used. The refractive index of the reflective layer is selected based on an assumption that a Ag electrode is used. A wavelength of light is selected as 550 nm which is a representative wavelength. The wavelength of 550 nm is suitable for the element design since the wavelength is within a range of visible light and within a range of green light which is highly visible.

FIG. 9A is a model illustrating the organic EL element in a case where the dipoles are randomly oriented. FIG. 9B is a model illustrating the organic EL element in a case where the dipoles are vertically oriented. FIG. 9C is a model illustrating the organic EL element in a case where the dipoles are horizontally oriented. The direction of dipole vibration is illustrated with a bidirectional arrow. The dipole orientation can be understood with a direction of the arrow. The centers of the dipoles are the light emitting points. A distance 53A, which is a distance between the light emitting point and the reflective layer 53, influences the plasmon loss.

Figure 10A:
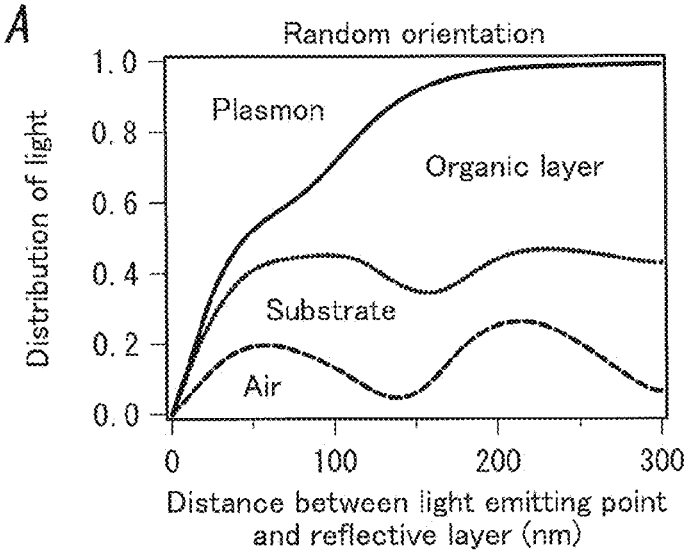
FIG. 10A, FIG. 10B and FIG. 10C are graphs illustrating a relationship between: a distance between a light emitting point and a reflective layer; and distribution of light, in an organic EL element which includes a light emitting layer having dipoles.
Figure 10B:
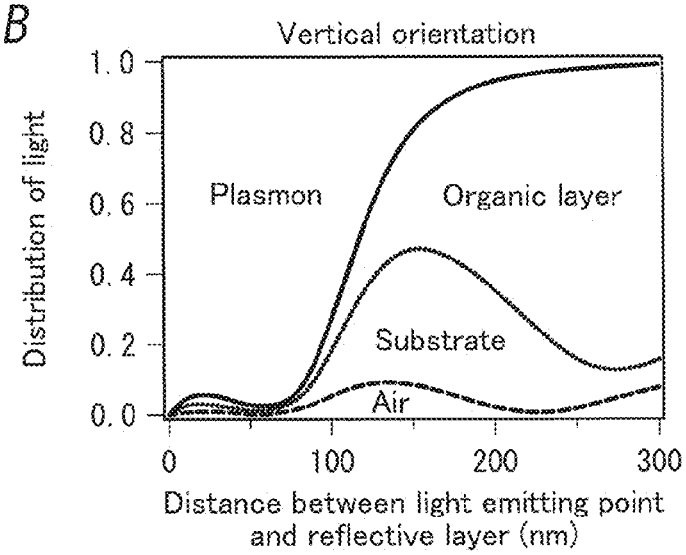
Figure 10C:
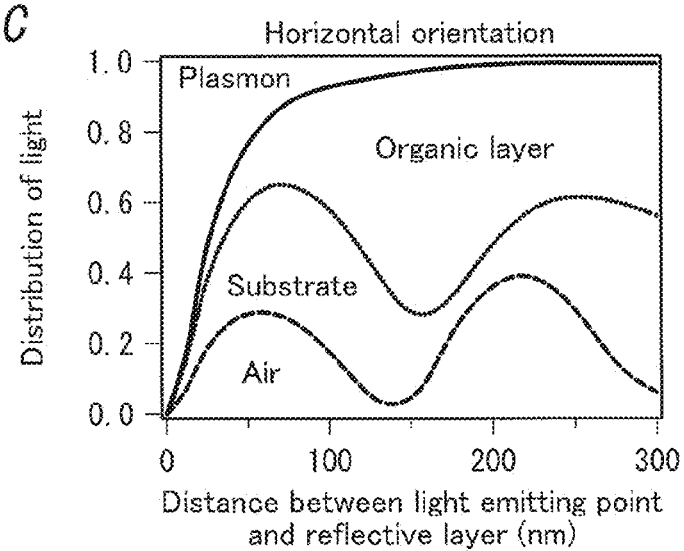

FIG. 10A, FIG. 10B and FIG. 10C are graphs illustrating distribution of light obtained from the models illustrated in FIG. 9A, FIG. 9B and FIG. 9C. FIG. 10A is a graph illustrating distribution of light in the organic EL element in which the dipoles are randomly oriented. FIG. 10A can be obtained from the model illustrated in FIG. 9A. FIG. 10B is a graph illustrating distribution of light in the organic EL element in which the dipoles are vertically oriented. FIG. 10B can be obtained from the model illustrated in FIG. 9B. FIG. 10C is a graph illustrating distribution of light in the organic EL element in which the dipoles are horizontally oriented. FIG. 10C can be obtained from the model illustrated in FIG. 9C. In FIG. 10A, FIG. 10B and FIG. 10C, a horizontal axis is the distance between the light emitting point and the reflective layer (the distance 53A in FIG. 9A, FIG. 9B and FIG. 9C). In FIG. 10A, FIG. 10B and FIG. 10C, a vertical axis is distribution of light and illustrates a percentage of light transitioned to each mode. Light is transitioned into modes of plasmon, the organic layer, the substrate, and air. The plasmon mode is a region where light is absorbed due to plasmon. The organic layer mode is a region where light is lost in the organic layer. The substrate mode is a region where light is lost in the substrate. The air mode is a region where light is extracted outside.

FIG. 10A indicates that the distance between the light emitting point and the reflective layer should be larger than about 200 nm to decrease influence by plasmon as much as possible in the random orientation which ignores the orientation of the molecules. However, since factors other than plasmon can influence the light-outcoupling efficiency, it cannot be said that making the distance large is an advantageous design.

As illustrated in FIG. 10B, the vertical orientation tends to receive a large influence by plasmon, and thus it is extremely difficult to extract light due to plasmon when the distance between the light emitting point and the reflective layer is smaller than 100 nm. Therefore, the vertically oriented dipoles are highly susceptible to the influence by plasmon.

As illustrated in FIG. 10C, the plasmon loss is lowered in the horizontal orientation, compared to the other orientations. When the distance between the light emitting point and the reflective layer is larger than 100 nm, it is possible to technically get rid of the influence by plasmon. In FIG. 10C, it is considered that the influence by plasmon is less dominant since the dipoles are horizontally oriented. It can be said that, in a preferable example of the organic EL element, the light emitting layer, which is the closest layer to the reflective layer (the reflective electrode) out of one or more light emitting layers, is arranged at least 100 nm further from the reflective layer. In addition, in terms of enhancing the intensity of light by interference, it may be preferable that the distance between the light emitting layer, which is the closest layer to the reflective layer out of the one or more light emitting layers, and the reflective layer is small. Therefore, in the organic EL element, the distance between the light emitting layer, which is the closest layer to the reflective layer (the reflective electrode) out of the one or more light emitting layers, and the reflective layer is preferable less than or equal to 300 nm and further preferable less than or equal to 200 nm. As a matter of course, the distance may be less than or equal to 100 nm. In this case, the light emitting layer can easily be arranged at a position called 1st cavity in light interference where most light is emitted forward. Light interference can be understood from distribution of light in the air mode being waves in FIG. 10A and FIG. 10C.

As obvious from a comparison among FIG. 10A to FIG. 10C, it is advantageous to orient the direction of dipole vibration in the horizontal direction, in terms of suppressing the plasmon loss. When the electrode which is the reflective layer is made of metal, p-polarized light interacts with the surface plasmon and lost. On the other hand, s-polarized light does not easily interact with plasmon. Therefore, the influence by plasmon can be decreased when s-polarized light is increased by orienting the dipoles horizontally.

The orientations of the dipole are explained. In the above, cases where the dipole is completely horizontally oriented and where the dipole is completely vertically oriented are discussed theoretically, but the orientations do not have to be complete orientations. For example, the orientation of the light emitting molecules (the dipoles) in the horizontal orientation may lean from the xy plane. This is still advantageous for the light-outcoupling efficiency, as understood from the above. In the three-dimensional coordinate system, the horizontal orientation may be a case where an angle between the direction of dipole vibration and the z-axis is larger than 45°. The horizontal orientation preferably is a case where the angle between the direction of dipole vibration and the z-axis is larger than 60° and further preferably is a case where the angle between the direction of dipole vibration and the z-axis is larger than 75°. In other words, it is sufficient if the direction of dipole vibration, which constitutes the light emitting molecules, leans with respect to the direction vertical to the surface of the light transmissive substrate 1.

In terms of the orientation of the light emitting molecules (the dipoles), some or all of the light emitting molecules included in the light emitting layer may have the orientation. In order to enhance the light-outcoupling efficiency, it is preferable that all of the light emitting molecules included in the light emitting layer have the orientation. Also, each of the light emitting molecules may have a slightly different orientation. The light-outcoupling efficiency can be enhanced as long as the light emitting molecules have the orientation as a whole. Such orientation of the light emitting molecules as a whole appears as the birefringence property. Therefore, the light emitting layer preferably has the birefringence property.

The organic EL element may emit white light. The above structure is advantageous when white light is emitted. White light can be obtained by mixing light with different colors using a plurality of dopants. For example, white light can be obtained when a blue light emitting material, a green light emitting material and a red light emitting material are used. The organic EL element may include a plurality of light emitting layers. It is preferable that at least one of the plurality of light emitting layers has the birefringence property. It is further preferable that all of the plurality of light emitting layers have the birefringence property.

When the dipoles, which are the light emitting molecules, are horizontally oriented, an amount of light having the relatively small incident angles increases. Therefore, it is advantageous to form an outcoupling structure to extract light, having relatively small incident angles, outside effectively in order to enhance the light-outcoupling efficiency. The organic EL element illustrated in FIG. 1 includes the at least one light-outcoupling structure 2 which is provided closer to the light-outcoupling side than the first electrode 3 and has the uneven structure 20. The uneven structure 20 includes the plurality of protrusions having substantially same heights which are individually allocated to some of the planar matrix-like sections so that the planar matrix-like sections become uneven. With regard to the unit regions consisting of same number of sections of the planar matrix-like sections, the ratio of the area of one or more of the plurality of protrusions in a unit region to the total area of the unit region is substantially constant in each unit region. Since the organic EL element includes the uneven structure 20, light is more effectively extracted when the dipoles are horizontally oriented. In addition, the at least one light-outcoupling structure 2 can contribute to improving a viewing angle characteristic. Thus, the organic EL element which has the high light-outcoupling efficiency and the excellent light emitting property can be obtained.

Hereinafter, preferable examples of the at least one light-outcoupling structure 2 are described.

[Light-Outcoupling Structure]

In the embodiment illustrated in FIG. 1, the at least one light-outcoupling structure 2 includes a first transparent material layer 21 and a second transparent material layer 22. The at least one light-outcoupling structure 2 preferably includes the first transparent material layer 21 and the second transparent material layer 22 which are arranged in this order from the light transmissive substrate 1. In this case, the uneven structure 20 can easily be formed at an interface between these two layers. A refractive index of the second transparent material layer 22 is preferably larger than the refractive index of the light transmissive substrate 1. In this case, a difference in the refractive indices can be reduced and therefore the light-outcoupling efficiency can be further improved. The uneven structure 20 is preferably formed at the interface between the first transparent material layer 21 and the second transparent material layer 22. The at least one light-outcoupling structure 2 consisting of a plurality of layers having the uneven structure 20 at (an) interface(s) thereof can contribute to improvement in the light-outcoupling efficiency, since light is diffused by the uneven structure 20. The at least one light-outcoupling structure 2 may be formed as a layer.

Furthermore, when the at least one light-outcoupling structure 2 includes two transparent material layers 21, 22, since the second transparent material layer 22 functions as a covering layer and planarizes the uneven structure 20, the light emitting stack 10 can be formed stably. Consequently, disconnection and short-circuiting due to unevenness can be suppressed. In addition, in a case where the covering layer is provided, the light emitting stack 10 can be formed and stacked finely even if height (depth) of the uneven structure 20 is large. As described above, the second transparent material layer 22 can function as a planarizing layer, and therefore it is preferable to provide the second transparent material layer 22. Also, since the transparent material layers 21, 22 are transparent and light transmissive, light can be extracted effectively.

In the at least one light-outcoupling structure 2, for example, the first transparent material layer 21 may serve as a low refractive index layer and the second transparent material layer 22 may serve as a high refractive index layer. It is more preferably that a refractive index for the visible wavelength range of the first transparent material layer 21 is within a range of 1.3 to 1.5 and a refractive index for the visible wavelength range of the second transparent material layer 22 is larger than or equal to 1.75.

The at least one light-outcoupling structure 2 (the first transparent material layer 21 and the second transparent material layer 22) is preferably made of resin. In this case, the refractive index can be easily adjusted, and formation and planarization of the protrusions and the recessions can be facilitated. When a resin material is used, resin with a relatively high refractive index can be easily obtained. Furthermore, since a layer can be formed by applying resin, a layer having a flat surface can be easily formed when resin fills up the recessions.

Examples of a material used for the first transparent material layer 21 may include organic resin such as acrylic resin and epoxy resin. Also, additives for curing the resin (such as a curing agent, a curing accelerator, and a curing initiator) may be added to the resin. The material used for the first transparent material layer 21 preferably has a small extinction coefficient k and ideally k=0 (or a value impossible to measure). Therefore, the first transparent material layer 21 preferably has the extinction coefficient k such that k=0 throughout the entire visible wavelength range. However, an allowable range of the extinction coefficient may be set depending on a thickness of a layer made of this material. Note that, examples of the material other than the resin may include inorganic materials. For example, the first transparent material layer 21 may be made of spin-on glass.

Examples of a material used for the second transparent material layer 22 may include resin with high refractive nano particles such as $TiO_2$ dispersed therein. The resin may include organic resin such as acrylic resin and epoxy resin. Also, additives for curing the resin (such as a curing agent, a curing accelerator, and a curing initiator) may be added to the resin. The material used for the second transparent material layer 22 preferably has a small extinction coefficient k and ideally k=0 (or a value impossible to measure). Note that, examples of the material other than the resin may include an inorganic film made of SiN and films made of inorganic oxides (such as $SiO_2$).

A surface provided by the second transparent material layer 22 (surface of the second transparent material layer 22 facing the first electrode 3) is preferable flat. In this case, disconnection and short-circuiting can be suppressed, leading to stable formation of the light emitting stack 10.

Note that, if a light emitting property or the like is sufficient even when the second transparent material layer 22 is not provided, the second transparent material layer 22 may be omitted. When the second transparent material layer 22 is not provided, the number of layers can be reduced, resulting in easier manufacturing of the element. For example, if the height of the protrusions and the recessions in the first transparent material layer 21 is small enough not to influence formation of the layer on top, the second transparent material layer 22 may be omitted. Even when the second transparent material layer 22 is not provided, the at least one light-outcoupling structure 2 having the uneven structure 20 can improve the light-outcoupling efficiency. However, in order to suppress disconnection and short-circuiting, the second transparent material layer 22 is preferably provided.

The first transparent material layer 21 and the second transparent material layer 22 can be formed by applying the material thereof on the surface of the light transmissive substrate 1. As a method for applying the material, an appropriate coating method can be employed. A spin coating method can be employed, or methods such as slit coating, bar coating, spray coating, and inkjetting can be employed depending on usage and a size of the substrate.

The uneven structure 20 between the first transparent material layer 21 and the second transparent material layer 22 may be formed by an appropriate method. It is preferable that the protrusions and the recessions of the uneven structure 20 are formed by an imprinting method. Fine protrusions and recession can be formed efficiently and precisely by the imprinting method. When the protrusions and the recessions are formed by allocating the protrusions or the recessions to each of uneven sections as described later, it is possible to form fine protrusions and recessions highly precisely by use of the imprinting method. When the protrusions and the recession are formed by the imprinting method, one of the uneven sections may be formed by one dot of printing. The imprinting method is preferably capable of forming fine structures, and for example, a method called nano-imprinting may be used.

The imprinting method is divided into major categories which are a UV imprinting method and a heat imprinting method and either one may be employed. For example, the UV imprinting method may be used. The uneven structure 20 may be formed by printing (transferring) the protrusions and the recessions using the UV imprinting method. In the UV imprinting method, for example, a film mold which is formed by impressing of a Ni master mold patterned with a rectangular (pillar) structure of 2 µm in period and 1 µm in height is used. UV curable imprint transparent resin is applied onto the substrate and the mold is pressed against a resin surface of the substrate. Thereafter, the resin is irradiated with UV light (for example i-line with wavelength of $\lambda=365$ nm) which passes through the substrate or the film mold, in order to cure the resin. The mold is removed after the resin is cured. In this process, the mold is preferably subjected to treatment for facilitating removal (such as fluorine coating treatment) in advance so that the mold can be removed easily from the substrate. In this manner, the protrusions and the recessions on the mold can be transferred to the substrate. Note that, the mold has protrusions and recessions corresponding to the shape of the uneven structure 20. Thus, when the protrusions and the recessions on the mold are transferred, the desired protrusions and recessions are provided on the transparent material layer. For example, when the mold in which the recessions are randomly allocated to sections is used, it is possible to obtain the uneven structure 20 in which the protrusions are randomly allocated.

Figure 11A:
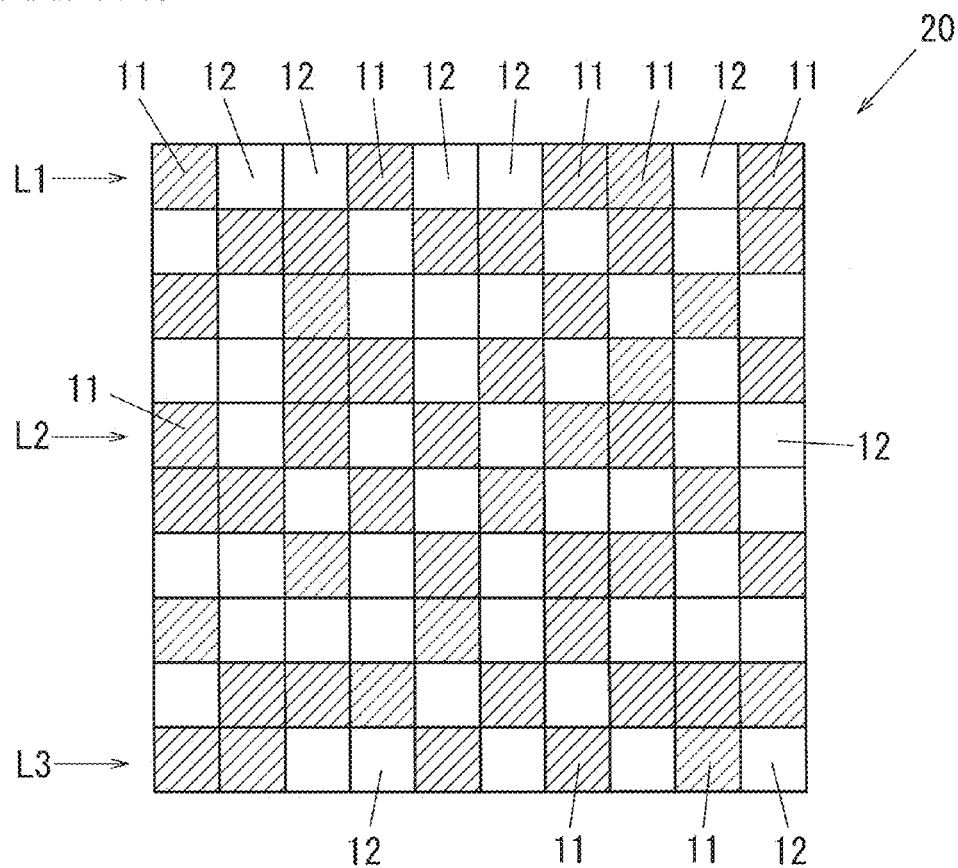
FIG. 11A and FIG. 11B are explanatory views explaining an example of an uneven structure.
Figure 11B:
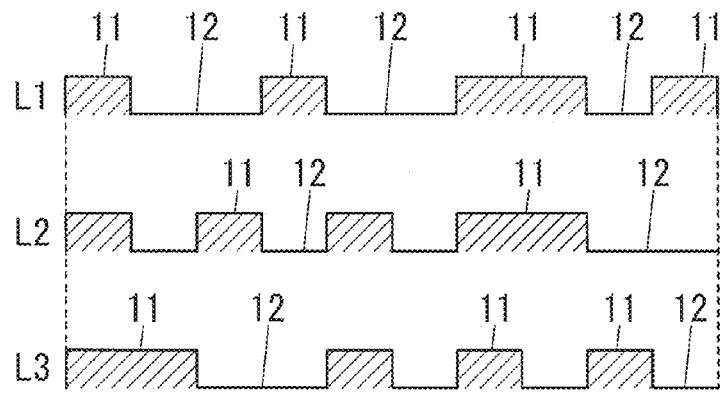

FIG. 11A and FIG. 11B illustrate an example of the uneven structure 20 in the at least one light-outcoupling structure 2. The uneven structure 20 in the at least one light-outcoupling structure 2 is preferably defined by a planar arrangement of the plurality of protrusions 11 or the plurality of recessions 12. In this case, more light produced in the horizontally oriented dipoles can be extracted outside. A plane on which the plurality of protrusions 11 or the plurality of recessions 12 are arranged may be a plane parallel to the surface of the light transmissive substrate 1. In FIG. 11A and FIG. 11B, the planar arrangement of the plurality of protrusions 11 is illustrated. In other words, the planar arrangement of the plurality of recessions 12 is illustrated. The uneven structure 20 may have a structure in which the plurality of protrusions 11 and the plurality of recessions 12 are arranged on the plane.

With regard to the uneven structure 20 in the at least one light-outcoupling structure 2, as illustrated in FIG. 11A and FIG. 11B, it is preferable that each of the plurality of protrusions 11 or each of the plurality of recessions 12 is allocated randomly to one of lattice-like sections. In this case, light diffusion is improved without causing angle-dependency and more light can be extracted outside. In one example of the lattice-like sections, each of the lattice-like sections has a quadrangular shape. The quadrangular shape is further preferably a square shape. In this case, a plurality of quadrangles is arranged successively in rows and columns, forming a matrix-like lattice (quadrangular lattice). In another example of the lattice-like sections, each of the lattice-like sections has a hexagonal shape. The hexagonal shape is further preferably a regular hexagonal shape. In this case, a plurality of hexagons is arranged next to each other with no space in-between, forming a honeycomb-like lattice (hexagonal lattice). Note that, a plurality of triangles may be arranged next to each other to form a triangular lattice, but the protrusions and the recessions are easily controlled in the quadrangular lattice or the hexagonal lattice.

The uneven structure 20 illustrated in FIG. 11A and FIG. 11B includes the plurality of protrusions 11 having substantially same heights which are individually allocated to some of the planar matrix-like sections so that the planar matrix-like sections become uneven. In addition, in the uneven structure 20, with regard to unit regions consisting of same number of sections of the planar matrix-like sections, the ratio of the area of one or more of the plurality of protrusions 11 in a unit region to the total area of the unit region is substantially constant in each unit region. The uneven structure 20 such as above can contribute to efficiently improving the light-outcoupling efficiency.

In the uneven structure 20 illustrated in FIG. 11A and FIG. 11B, FIG. 11A illustrates a view in the direction perpendicular to the surface of the light transmissive substrate 1, and FIG. 11B illustrates a view in the direction parallel to the surface of the light transmissive substrate 1. In FIG. 11A, the sections where the protrusions 11 are provided are illustrated with hatching. Structures indicated by lines L1, L2, and L3 in FIG. 11A correspond to structures indicated by lines L1, L2, and L3 in FIG. 11B, respectively.

As illustrated in FIG. 11A, the uneven structure 20 is constituted by the protrusions 11 each of which is allocated to a desired section of the matrix-like uneven sections, in which a plurality of squares are arranged in length and width directions (rows and columns). The uneven sections have same areas. Either a protrusion 11 or a recession 12 is allocated to of the uneven sections (each uneven section). The protrusions 11 may be allocated systematically or randomly. In the embodiment illustrated in FIG. 11A and FIG. 11B, the protrusions 11 are allocated randomly. As illustrated in FIG. 11B, in the section to which the protrusion 11 is allocated, the protrusion 11 is formed by making part of the material constituting the uneven structure 20 protrude towards the light transmissive electrode 3. Also, the plurality of protrusions 11 has substantially same heights. Note that, the plurality of protrusions 11 having substantially same heights may mean, for example, that, when the heights of the plurality of protrusions 11 are averaged out, the height of each of the plurality of protrusions 11 is within ±10% of the average height or preferably within ±5% of the average height.

In FIG. 11B, a cross-sectional shape of each of the plurality of protrusions 11 is a rectangular shape but may be an appropriate shape such as a corrugated shape, an inverted-triangle shape, and a trapezoidal shape. When two protrusions 11 are adjacent to each other, these protrusions 11 are connected integrally to form a larger protrusion 11. When two recessions 12 are adjacent to each other, these recessions 12 are connected integrally to form a larger recession 12. The number of connected protrusions 11 and the number of connected recessions 12 are not limited particularly. However, as these numbers increase, the uneven structure 20 tends not to have fine structures. For example, the numbers may be appropriately set to be equal to or less than 100, 20, or 10. Note that, it is possible to introduce a design rule defining that when two or three or more recessions 12 or two or three or more protrusions 11 are continuously arranged, a region next to such continuous regions is set to correspond to the other of the recession 12 and the protrusion 11 (when the specific region is recessed, the next region is protruded, and when the specific region is protruded, the next region is recessed). When this rule is used, a light diffusion effect is improved, and therefore it is expected that the efficiency and a color difference can be improved.

The uneven structure 20 is formed so that with regard to the unit regions consisting of same number of sections of the planar matrix-like sections, the ratio of the area of one or more of the plurality of protrusions 11 in a unit region to the total area of the unit region being substantially constant in each unit region. For example, in FIG. 11A, one hundred uneven sections are arranged in a 10 by 10 matrix manner. A region constituted by these one hundred sections may be used as a unit region. In the plane on which the uneven structure 20 is provided, the ratio of the area of the protrusions 11 to the total area of the unit region is same in any unit region. For example, as shown in FIG. 11A, when fifty protrusions 11 are provided to a unit region, about fifty (for example, forty-five to fifty-five or forty-eight to fifty-two) protrusions 11 may be provided to another unit region which consists of the same number of uneven sections and has the same area as the unit region. A unit region is not limited to a region corresponding to one hundred sections, but may be a region having a size corresponding to an appropriate number of sections. For example, the number of sections defined as a unit region may be 1000, 10000, 1000000, or more. The ratio of the area of the protrusions 11 to the total area of the unit region slightly varies depending on how to define the unit region. However, in this example, the ratios of the area of the protrusions 11 to the total area of the unit region are set to be substantially same. For example, a difference between each of upper and lower limits of the area ratio and an average of the area ratio is preferably equal to or less than 10% of the average, and more preferably equal to or less than 5% of the average, and more preferably equal to or less than 3% of the average, and more preferably equal to or less than 1% of the average. As the area ratios in the unit regions become closer in values to each other, the light-outcoupling efficiency can be more improved more evenly throughout the plane. The ratio of the area of the protrusions 11 to the total area of the unit region is not limited particularly, but may be within a range of 20% to 80%, and preferably within a range of 30% to 70%, and more preferably within a range of 40% to 60%.

In a preferable example, the protrusions 11 and the recessions 12 are arranged randomly within each unit region. In this case, it is possible to extract more light to outside. In this case, the uneven structure 20 has the plurality of protrusions 11 and the plurality of recessions 12 randomly arranged. The random arrangement of the protrusions 11 and the recessions 12 is advantageous when wavelength-band is wide. The random arrangement can especially be used for the organic EL element which emits white light. Furthermore, the random arrangement of the protrusions 11 and the recessions 12 can improve the viewing angle characteristic. The viewing angle characteristic means a phenomenon of change in color of the emitted light depending on an angle of observation. When the viewing angle characteristic is improved, change in color depending on the angle of observation decreases.

The uneven structure 20 preferably includes fine protrusions and recessions. Thus, the light-outcoupling efficiency can be more improved. For example, when each of the matrix-like uneven sections is formed as a square with a side in a range of 0.1 µm to 100 µm, it is possible to form a fine uneven structure. The side of the square defining one of the uneven sections may be within a range of 0.4 µm to 10 µm. For example, when the side of the square is 1 µm, it is possible to form the fine uneven structure 20 precisely. Further, the unit region may be a region in a shape of 1 mm square or 10 mm square. Note that, in the uneven structure 20, a material forming the uneven structure 20 may not be present in the recessions 12. In this case, the lower layer (the first transparent material layer 21) of the uneven structure 20 may be a layer in which a plurality of fine protrusions 11 are distributed on the entire surface in an island manner. For example, the second transparent material layer 22 may be directly in contact with the substrate 1 at the recession(s) 12.

The height of each of the plurality of protrusions 11 is not particularly limited but may be within a range of 0.1 to 100 µm. In this case, the uneven structure 20 with the high light-outcoupling efficiency can be obtained. For example, when the height of each of the plurality of protrusions 11 is set to be within a range of 1 to 10 µm, the fine protrusions and recessions can be precisely formed.

The plurality of protrusions 11 constituting the uneven structure 20 may have the same shape. In FIG. 11A, the protrusion 11 is provided to entirely cover one uneven section, and thus the protrusion 11 has a quadrangle (rectangular or square) shape in a plan view. The shape of the protrusions 11 in a plan view is not limited to this example, but may be another shape such as a circular shape and a polygonal shape (such as a triangular shape, a pentagonal shape, a hexagonal shape, and an octagon shape). In these cases, a three-dimensional shape of the protrusion 11 may be an appropriate shape such as a cylindrical shape, a prism shape, (such as a triangular prism shape and a rectangular prism shape), a pyramid shape (such as a triangle-based pyramid, and a rectangle-based pyramid).

In a preferable example, the uneven structure 20 is formed as a diffraction optical structure. In this case, the plurality of protrusions 11 is preferably provided to show some degree of regularity to give the diffraction optical structure. In the diffraction optical structure, the plurality of protrusions 11 further preferably has a periodic structure. When the at least one light-outcoupling structure 2 includes the diffraction optical structure, the light-outcoupling efficiency can be improved. In this case, the uneven structure 20 has a periodic arrangement of the plurality of protrusions 11 and the plurality of recession 12. In such a structure, the light-outcoupling efficiency can be further enhanced with respect to a certain wavelength and direction.

In the diffraction optical structure, it is preferable that an interval P of two-dimensional uneven structure 20 (average interval of the uneven structure in a case where the uneven structure 20 is not periodic) be appropriately set to be within a range of about $\lambda/4$ to about $100\lambda$ wherein $\lambda$ is a wavelength in a medium (which is obtained by dividing a wavelength in vacuum by a refractive index of the medium). This range may be used in a case where a wavelength of light emitted from the light emitting layer 5 is within a range of 300 to 800 nm. In this case, the light-outcoupling efficiency can be improved due to a geometrical optics effect, i.e. enlargement of an area of the surface which light strikes at an angle less than the total reflection angle, or due to light striking the surface at an angle not less than the total reflection angle which is emitted outside as diffraction light. In addition, when the interval P is set especially small (for example, within a range of $\lambda/4$ to $\lambda$), an effective refractive index around the uneven structure gradually decreases as becoming distant from the surface of the substrate. This is equivalent to interposing, between the substrate and a layer covering the uneven structure or between the substrate and the anode, a thin film layer which has a refractive index between the refractive index of the medium of the uneven structure and the refractive index of the covering layer or the anode. Consequently, it is possible to suppress Fresnel reflection. In other words, when the interval P is set within a range of $\lambda/4$ to $100\lambda$, reflection (total reflection and/or Fresnel reflection) can be suppressed and thus the light-outcoupling efficiency can be improved. Even in this range, when the interval P is smaller than $\lambda$, only the effects of suppressing Fresnel loss can be expected, and the light-outcoupling efficiency is likely to decrease. On the other hand, when the interval P is larger than $20\lambda$, the heights of the protrusions and the recessions need to become larger (in order to ensure a phase difference), and thus planarization by the covering layer (the second transparent material layer 22) is likely to become less easy. Using the covering layer having a quite large thickness (for example, larger than or equal to 10 μm) can be considered, but this method is disadvantageous due to unpreferable effects such as lowered transmittance, increased cost of materials, and increased outgas when using resin materials. In view of this, the interval P is preferably set, for example, within a range of $\lambda$ to $20\lambda$.

The uneven structure 20 may have a boundary diffraction structure. The boundary diffraction structure may be formed by randomly arranging the plurality of protrusions 11. Alternatively, the boundary diffraction structure may be a structure in which diffraction structures formed within very small regions of a plane are arranged all over the plane. This structure can be interpreted as a structure having a plurality of independent diffraction structures arranged in plane. In the boundary diffraction structure, diffraction caused by the fine diffraction structures can contribute to extraction of light and lowering the angle-dependency of light by suppressing light diffraction becoming too intense on the entire surface. Therefore, the light-outcoupling efficiency can be enhanced, suppressing the angle-dependency.

In a case where the plurality of protrusions 11 and the plurality of recessions 12 are arranged randomly as described in FIG. 11A and FIG. 11B, if too many protrusions 11 or recessions 12 are arranged successively, the light-outcoupling efficiency might not be enhanced sufficiently. In view of this, a further preferable example of the uneven structure 20 is described hereinafter.

[Controlling Randomness of Uneven Structure]

Randomness of an arrangement of the protrusions and the recessions in the uneven structure 20 is preferably controlled. The shape of the uneven structure 20 is defined as follows. A structure with a completely random arrangement of the protrusions and the recessions is defined as a complete random structure. A structure with a random arrangement of the protrusions and the recessions under a predetermined rule is defined as a controlled random structure. A structure with a periodic arrangement, which is not random, of the protrusions and the recessions under a predetermined rule is defined as a periodic structure. Furthermore, one of the lattice-like sections is considered as a block. A size of one block is defined as w. When the block is a quadrangle, the size of the block means a side of the quadrangle. When the block is a hexagon, the size of the block means a diameter of a circle inscribed in the hexagon. With regard to a large protrusion 11 which is formed with continuously arranged protrusions 11, when there are a first large protrusion 11 and a second large protrusion 11 which is next to but is spaced from the first large protrusion 11, a distance between the same sides of the first and the second large protrusions 11 is defined as an average interval. The average interval is equal to an average pitch.

When controlling the controlled random structure, it is preferable to set a rule defining that the number of same blocks (corresponding to one of the protrusion 11 and the recession 12) arranged continuously must not be greater than a predetermined number. In other words, it is preferable that the protrusions 11 are arranged so that the number of protrusions 11 arranged continuously in a same direction in the lattice-like sections is no greater than the predetermined number, and the recessions 12 are arranged so that the number of recessions 12 arranged continuously in a same direction in the lattice-like sections is no greater than the predetermined number. Consequently, the light-outcoupling efficiency can be more improved. Further, the angle dependency of the color of the emitted light can be reduced. The predetermined number defining the maximum number of the protrusions 11 or the recessions 12 which are arranged continuously is preferably less than or equal to 10, and is more preferably less than or equal to 8, and is more preferably less than or equal to 5, and is more preferably less than or equal to than 4.

Figure 12A:
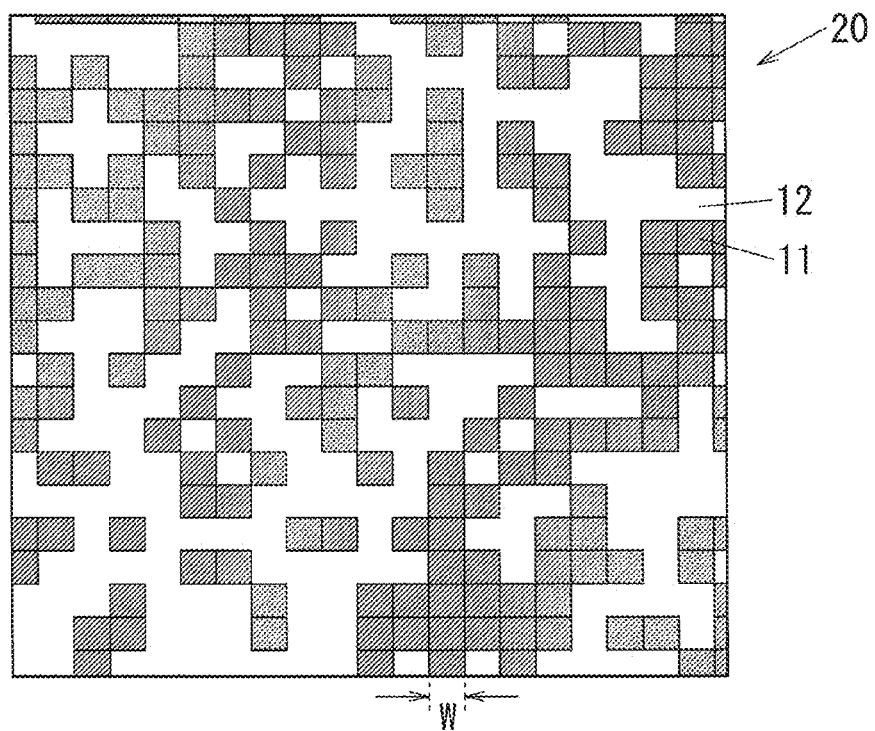
FIG. 12A is a plan view illustrating an example of an uneven structure.
Figure 12B:
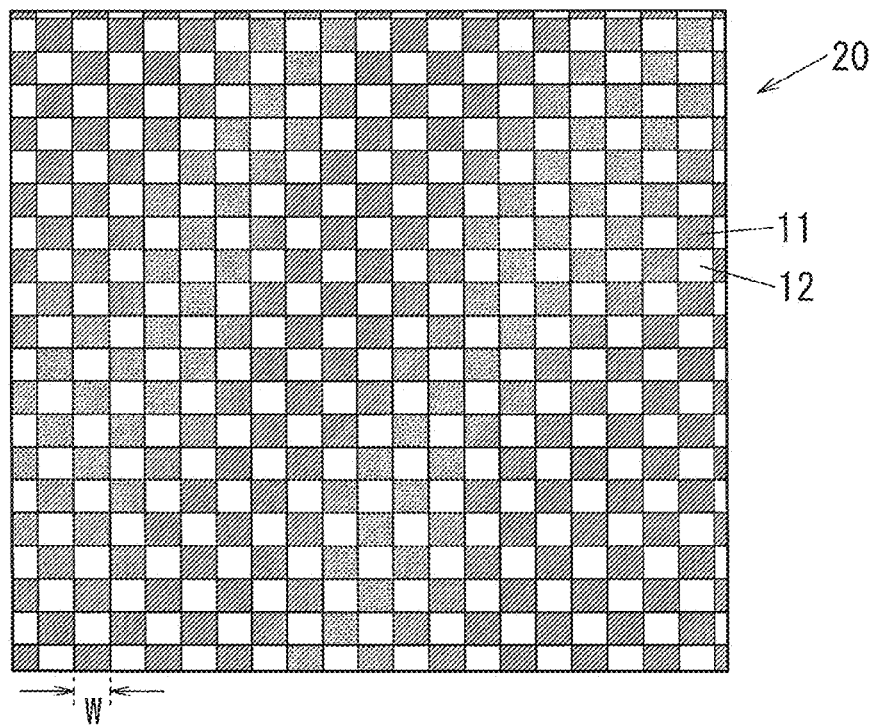
FIG. 12B is a plan view illustrating an example of an uneven structure.

The principle of the uneven structure 20 is described with reference to FIG. 12A and FIG. 12B. FIG. 12A illustrates the uneven structure 20 corresponding to the complete random structure, and FIG. 12B illustrates the uneven structure 20 corresponding to the periodic structure. Hatched parts denote the protrusions 11, and white parts denote the recessions 12. This is also applied to the following explanatory views of the uneven structure 20.

When blocks with a certain size w are arranged systematically with periodicity as shown in FIG. 12B, the average interval is 2w. That is, the protrusions 11 and the recessions 12 are arranged alternately, and therefore the protrusions 11 are arranged at the average interval corresponding to a total size of two blocks. Note that, in the example of FIG. 12B, the uneven structure 20 has a checker pattern.

When the blocks with a certain size w are arranged completely randomly as illustrated in FIG. 12A, the average interval is 4w.

The average interval in the complete random structure can be calculated using probability theory. In a random arrangement, a probability that the same blocks are arranged continuously is considered. First, a probability that the block (the protrusion 11) with a width w exists is ½. Then, a probability that the two same blocks are arranged consecutively is $(½)^2$. Further, a probability that the three same blocks are arranged consecutively is $(½)^3$. The "^n" denotes the n-th power. Same as above, a probability that the four or more same blocks are arranged consecutively is considered. In this manner, an expectation value of a width of a region in which the same blocks are arranged consecutively can be calculated. The block is either the protrusion 11 or the recession 12 in this method. Therefore, the average interval is calculated by using the above expectation values. Hence, when the blocks are arranged completely randomly, the average interval is equal to 4w. Also in a case of the hexagonal lattice, as with the above, it is possible to calculate that the average interval is equal to 4w, based on probabilistic approach.

Similarly, in the structure with controlled randomness (controlled random structure), the average interval can be calculated based on probabilistic approach. When controlling the structure so that the number of the same blocks arranged consecutively is less than the predetermined number, the average interval can be determined by calculating the expectation value, removing a probability when the number of same blocks arranged continuously is larger than or equal to the predetermined number.

Figure 13:
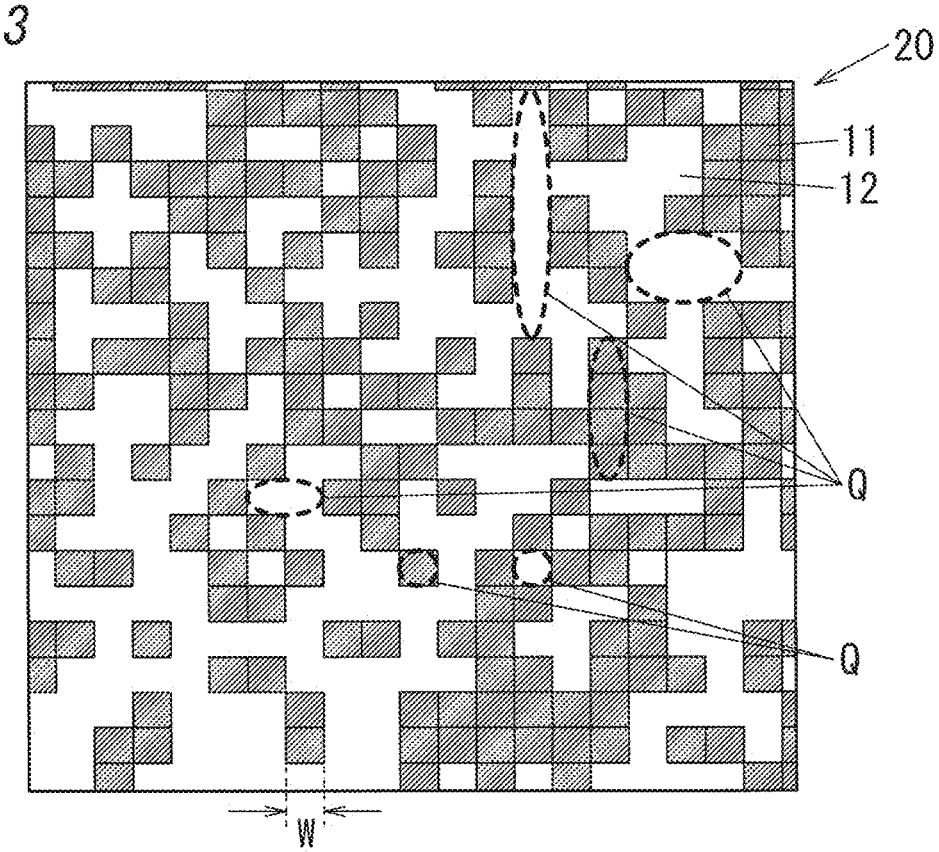
FIG. 13 is a plan view illustrating an example of an uneven structure and an explanatory view illustrating an example of a method for determining an average pitch.

Also, the average interval in the complete random structure can be calculated based on the structural pattern. FIG. 13 is an explanatory view illustrating a method to calculate the average interval using the structure. A width of a section of the lattice is denoted as "w".

As illustrated in FIG. 13, an ellipse Q can be drawn so as to be inscribed in a shape defined by a boundary of a region in which the same blocks (the protrusions 11 or the recessions 12) are continuous. When the ellipse Q to be drawn is a circle, an inscribed circle is drawn. The average interval is calculated from a length of a major axis and a length of a minor axis of the ellipse Q. In the case of the inscribed circle, a diameter is used. In an example of FIG. 13, the minimum value of the length of the minor axis of the inscribed ellipse is equal to w, that is, the boundary width. Further, the maximum value of the length of the major axis of the inscribed ellipse can be considered to be 10w. Note that, when the probability that the same blocks are arranged consecutively is ½, the same blocks may be consecutively arranged endlessly. For example, the probability that "n" protrusions 11 are arranged consecutively is represented by (½)^n. The probability that ten protrusions 11 are arranged consecutively is (½)^10=1/1028=0.00097. The probability of presence of the arrangement in which ten protrusions 11 are arranged consecutively is equal to or less than 0.1%. This probability is extremely low and can be ignored. Therefore, as with the above, the maximum value of the length of the major axis of the inscribed ellipse may be considered to be 10w. Based on structural calculation, the average of the lengths of the axes of the inscribed ellipse Q is determined to be 2w. This 2w means the average boundary width. Since the average pitch is a sum of the average boundary width of the protrusions 11 and the average boundary width of the recessions 12, 2w should be multiplied by two. Therefore the average pitch is 4w.

Figure 14:
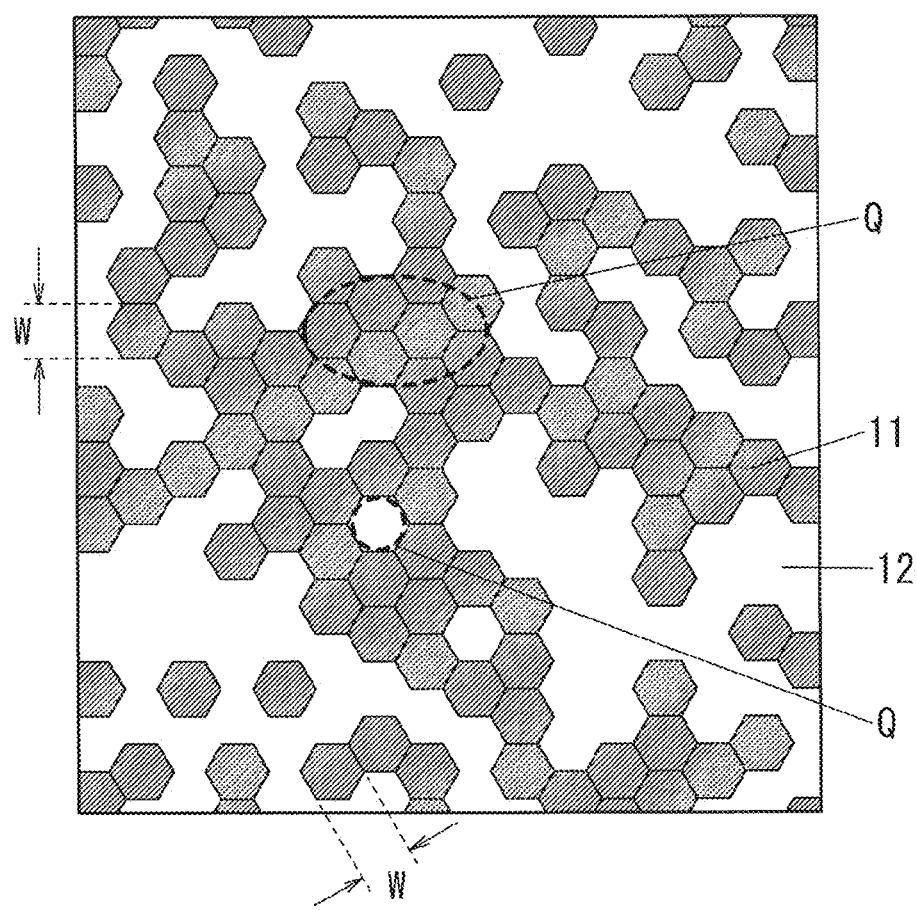
FIG. 14 is a plan view illustrating an example of an uneven structure and an explanatory view illustrating an example of a method for determining an average pitch.

FIG. 14 illustrates an example of the uneven structure 20 with the complete random structure of a hexagonal lattice. The width of a section of the lattice is denoted as "w". The average pitch can be calculated based on lengths of axes of an inscribed ellipse Q as with the quadrangular lattice. Thus, the minimum value of the length of the minor axis of the inscribed ellipse is w, and is equal to the boundary width. Further, the maximum value of the length of the major axis of the inscribed ellipse may be considered to be 10w. The average of the lengths of the axes of the inscribed ellipse Q is determined to be 2w. This 2w means the average boundary width. Therefore the average pitch is 4w.

Figure 15A:
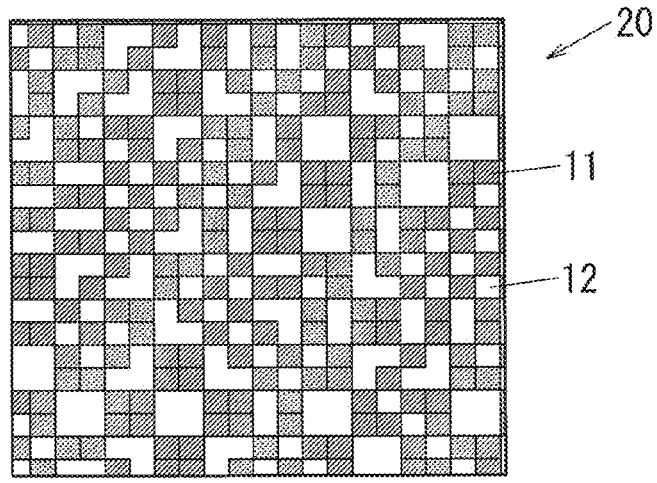
FIG. 15A is a plan view illustrating an example of an uneven structure.
Figure 15B:
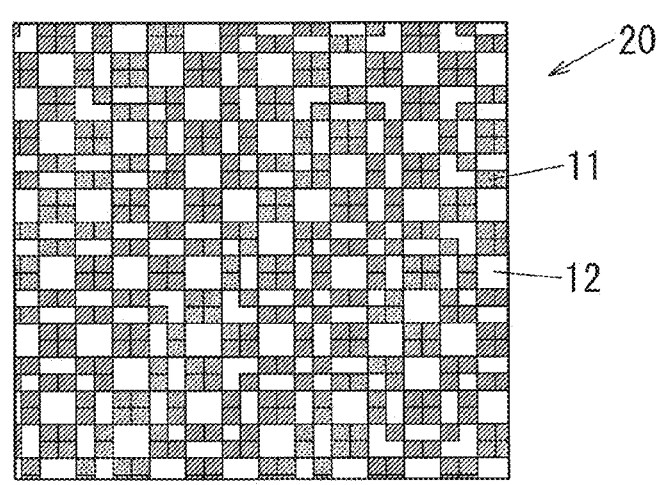
FIG. 15B is a plan view illustrating an example of an uneven structure.
Figure 15C:
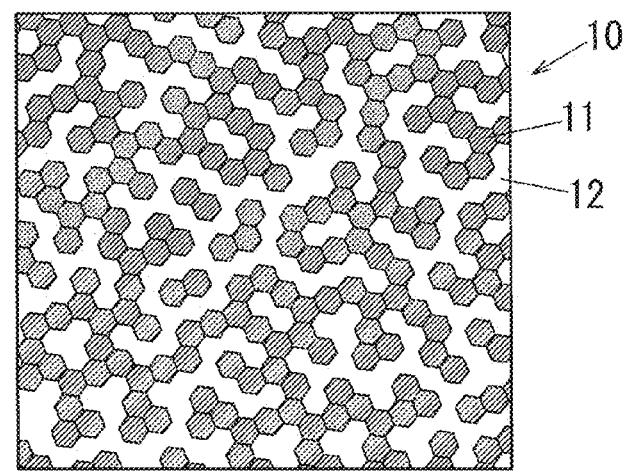
FIG. 15C is a plan view illustrating an example of an uneven structure.

FIG. 15A, FIG. 15B and FIG. 15C illustrate examples of the uneven structure 20 with the controlled random structure. FIG. 15A illustrates the quadrangular lattice structure with the average pitch of 3w. FIG. 15B illustrates the quadrangular lattice structure with the average pitch of 3.3w. FIG. 15C illustrates the hexagonal lattice structure with the average pitch of 3.4w. These average pitches are calculated by the above described manner. In FIG. 15A and FIG. 15B, the structures are controlled so that three same blocks (the protrusions 11 or the recessions 12) are not arranged consecutively in the same direction. In FIG. 15C, the structure is controlled so that four same blocks (the protrusions 11 or the recessions 12) are not arranged consecutively in the same direction.

In the uneven structure 20, it is preferable that the average pitch of the plurality of protrusions 11 and the plurality of recessions 12 is less than the average pitch of the plurality of protrusions 11 and the plurality of recessions 12 randomly arranged. In this case, more light can be extracted. The uneven structure 20 is preferably the controlled random structure. The controlled random structure can be considered as a structure which removes low frequency components. Therefore, the controlled random structure may be referred to as a low frequency removing structure. The average pitch of the plurality of protrusions 11 and the plurality of recessions 12 may be set, for example, as a value larger than 2w and smaller than 4w. w is the width of one of the uneven sections. The average pitch may be considered equivalent to the average interval.

The method of controlling randomness by suppressing occurrence of the large region constituted by consecutively arranged blocks and the effect thereof are described as above. The effects by suppressing occurrence of such a large region can also be confirmed by Fourier transformation of random patterns.

Figure 16A:
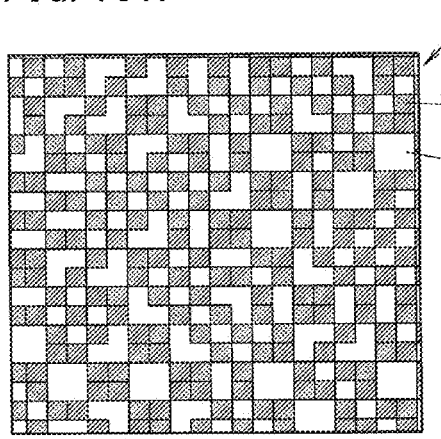
FIG. 16A is a plan view illustrating an example of an uneven structure.
Figure 16B:
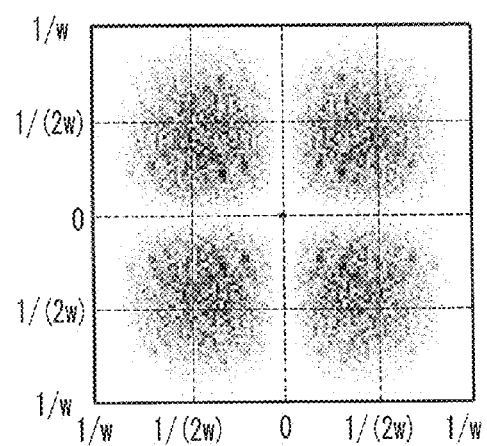
FIG. 16B is a distribution map illustrating Fourier transformation of the uneven structure illustrated in FIG. 16A.
Figure 16C:
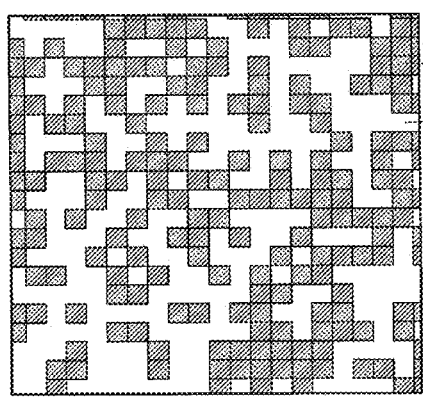
FIG. 16C is a plan view illustrating an example of an uneven structure.
Figure 16D:
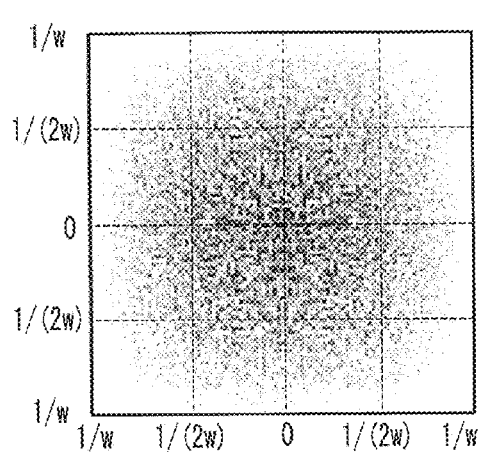
FIG. 16D is a distribution map illustrating Fourier transformation of the uneven structure illustrated in FIG. 16C.

FIG. 16A to FIG. 16D include views illustrating amplitudes of spatial frequency components obtained by the Fourier transformations of the random patterns. FIG. 16A shows the random pattern of the controlled random structure, and FIG. 16B shows the result of the Fourier transformation of the random pattern illustrated in FIG. 16A. FIG. 16C shows the random pattern of the complete random structure, and FIG. 16D shows the result of the Fourier transformation of the random pattern illustrated in FIG. 16C.

In each of FIG. 16B and FIG. 16D, the center of the view indicates a component (DC component) corresponding to the spatial frequency of 0. The spatial frequency becomes greater towards the periphery of the view than at the center of the view. As understood from the views, it is confirmed that the low frequency components are suppressed in the spatial frequency of the controlled random pattern. Especially, it is understood that components, which are lower than $1/(2w)$, of the spatial frequency components are suppressed. Thus, it is preferable that the uneven structure 20 is a structure in which components, lower than $1/(2w)$, of the spatial frequency components are suppressed. When the randomness is controlled as described above, the low frequency components are removed. In view of this, the controlled random structure may be referred to as the low frequency removing structure.

Even when the randomness is controlled, the average pitch can be calculated. Note that, the boundary width (structural size) w is preferably larger than or equal to $0.73\lambda$. The value of 0.73 is obtained by dividing 400 by 550. The upper limit of the average pitch is preferably 8 μm.

Further, the structural size w (a length of each of the lattice-like sections) is preferably within a range of 0.4 μm to 4 μm. Moreover, the structural size w is preferably within a range of 0.4 μm to 2 μm.

Note that, in the aforementioned uneven structure 20, the heights of the protrusions and the recessions are same. However, the heights of the protrusions and the recessions may be random. Since the uneven structure 20 is constituted by stacked layers of two transparent materials, and phase differences may occur when light passes through these parts. Even when the heights are random, the average phase differences of rays of transmitted light may be determined by a plurality of average heights. Hence, also in this case, since sufficient average phase differences are given to rays of transmitted light and light can be extracted, the heights may be random.

[Optical Matching]

Described hereinafter is an optical matching of the light emitting layer 5 with the birefringence property and the aforementioned light-outcoupling structure 2.

As described above, it is advantageous to control light by horizontally orienting the dipoles. Moreover, in the organic EL element, since the above described light-outcoupling structure 2 is used, the light-outcoupling efficiency can be improved when the direction of dipole vibration is oriented in the horizontal direction. In description of the horizontally oriented dipole, a simulation is carried out based on an assumption that the interfaces between the substrate, the organic layer, and air are flat (without any optical structure such as the at least one light-outcoupling structure 2). However, the light-outcoupling efficiency can be further enhanced by optimizing the optical structure. When combining the light emitting layer 5 with the birefringence property and the optical structure such as a scattering structure and a diffusion structure, it is important to make the optical structure suitable for the light emitting layer 5 since light which normally does not experience total reflection might not easily be extracted depending on the optical structure.

Figure 17A:
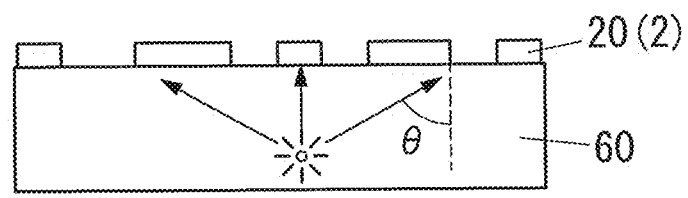
FIG. 17A to FIG. 17E are models of optical structures.
Figure 17B:
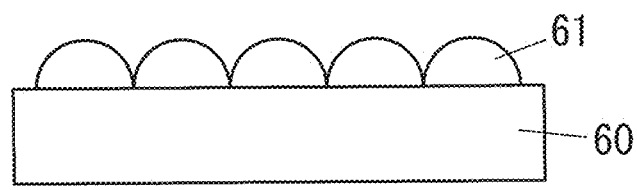
Figure 17C:
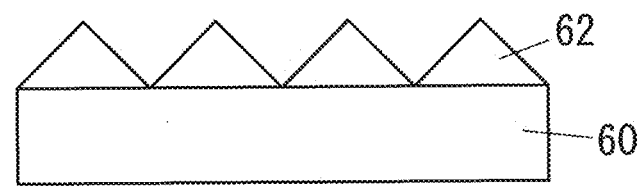
Figure 17D:
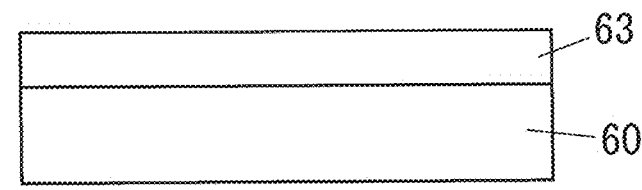
Figure 17E:

FIG. 17A to FIG. 17E are schematic diagrams illustrating models of the optical structures. In FIG. 17A to FIG. 17E, schematic models of various optical structures formed on a light emitting source including layer 60 are illustrated. FIG. 17A illustrates the at least one light-outcoupling structure 2 having the uneven structure 20 as described above. The at least one light-outcoupling structure 2 is the low frequency removing structure (structure in which the random arrangement of the protrusions and the recessions is controlled). FIG. 17B illustrates a micro lens array structure. The micro lens array structure is a structure with a planar arrangement of a plurality of fine hemispherical lenses 61. FIG. 17C illustrates a micro pyramid array structure. The micro pyramid array structure is a structure with a planar arrangement of a plurality of fine pyramidal (quadrangular pyramidal) structures 62. FIG. 17D illustrates a scattering structure. The scattering structure is a structure in which a scattering layer 63 with light scattering particles dispersed therein is formed. FIG. 17E illustrates a mirror surface structure which does not have an optical structure to extract light.

Light transmittance with respect to the incident angle of light was calculated by an optical simulation using the models illustrated in FIG. 17A to FIG. 17E. In FIG. 17A, the incident angle of light is denoted as θ. The wavelength of light is assumed to be 550 nm. A refractive index of the light emitting source including layer 60 is assumed to be 1.51, based on an assumption that glass is used. Strictly speaking, a refractive index of the organic layer may be taken into account. However, the above assumption is sufficient for the simulation when considering light extracted to air. A refractive index of the light outcoupling side (outside) is assumed to be 1, based on an assumption that light is extracted to air.

In a model of the controlled random structure (the low frequency removing structure) illustrated in FIG. 17A, the uneven sections are assumed to be sections in the hexagonal lattice, the height of the protrusions (or the recessions) is assumed to be 800 nm, and the average interval of the protrusions and the recessions is assumed to be 1800 nm. In a model of the micro lens array structure illustrated in FIG. 17B, a diameter of a lens is assumed to be 15 μm, and a height of the lens is assumed to be 7.5 μm. In a model of the micro pyramid structure illustrated in FIG. 17C, a pitch of a pyramid structure is assumed to be 10 μm, and an apex angle of the pyramid is assumed to be 60°. In a model of the scattering structure illustrated in FIG. 17D, a radius of the light scattering particle is assumed to be 2.5 μm, and a filling rate of the light scattering particles is assumed to be 30 volume %. These parameters are assumed as above so that overall transmittance is favorable with light with a wavelength of 550 nm.

Figure 18:
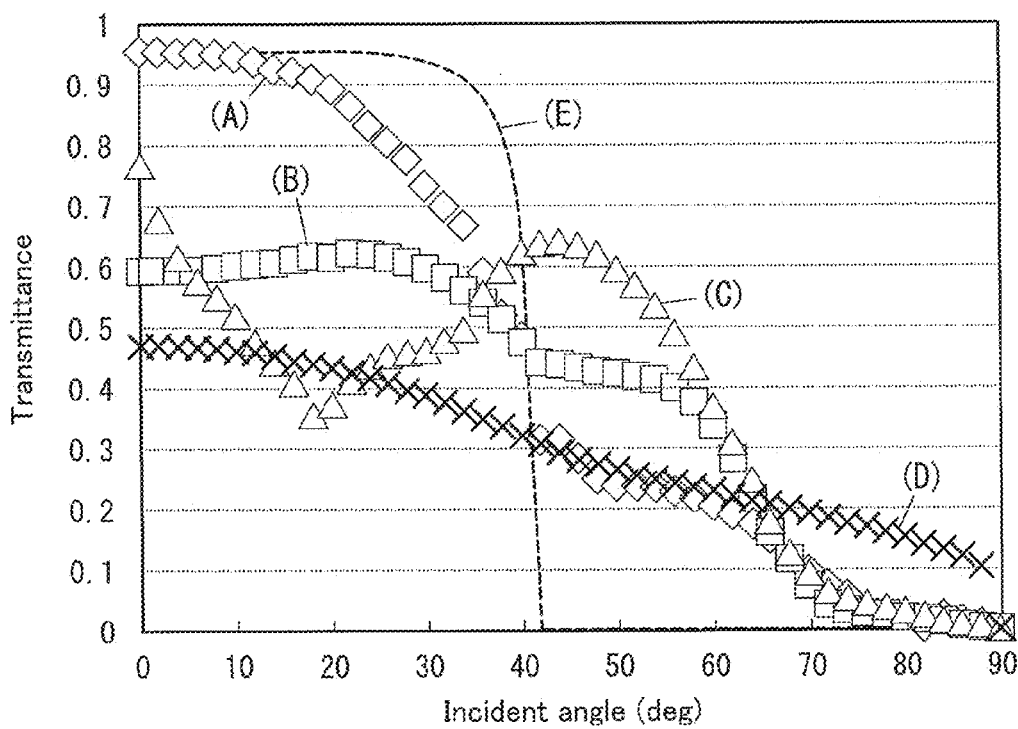
FIG. 18 is a graph illustrating a relationship between an incident angle and transmittance of light when optical structures are varied.

FIG. 18 is a graph showing results of the optical simulation. In FIG. 18, the incident angle of light is shown in the horizontal axis, and the light transmittance is shown in the vertical axis. In FIG. 18, (A) to (E) correspond to the models illustrated in FIG. 17A to FIG. 17E, respectively.

As illustrated in FIG. 18, the transmittance at low angles in (A) having the controlled random structure is higher than the transmittance at low angles in other structures.

Components with low incident angles account for a large portion of light generated when the dipoles are horizontally oriented. Therefore, a structure with the birefringence property matches well with the optical structure of (A) (the uneven structure 20) and is capable of extracting light outside efficiently.

Also in the mirror surface structure of (E) (structure which does not have an optical structure to extract light), the transmittance tends to be higher at angles, at which total reflection does not occur, less than or equal to the critical angle. The critical angle is about 42°. However, in the mirror surface structure, it cannot be expected to extract light after total reflection by changing the incident angle of the totally reflected light. Since light cannot change its direction in the mirror surface structure, no matter how many times light entering at the incident angle greater than or equal to the critical angle is reflected, the light can only enter at the incident angle greater than or equal to the critical angle. On the other hand, in the optical structure such as the low frequency removing structure having the protrusions and the recessions, even if light is not transmitted at its first entrance, the incident angle of the light changes every time the light is reflected and thus the light can be extracted at its second or manieth entrance. Therefore, it is overall advantageous to have a structure for extracting light, such as the at least one light-outcoupling structure 2 described above.

Figure 19:
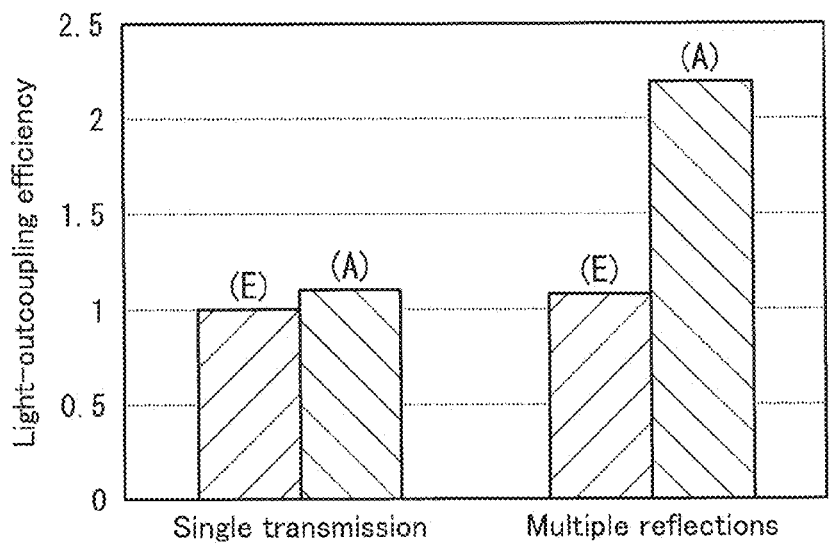
FIG. 19 is a graph illustrating a change in light-outcoupling efficiency when multiple reflections are considered.

FIG. 19 is a graph illustrating a difference in the light-outcoupling efficiencies of the low frequency removing structure (the controlled random structure) and the mirror surface structure, with multiple reflections taken into account. The low frequency removing structure is shown as (A) and the mirror surface structure is shown as (E). The light out-coupling efficiencies with single transmission are illustrated in the left side, and the light-outcoupling efficiencies with multiple reflections are illustrated in the right side. The light-outcoupling efficiency with single transmission in the mirror surface structure is standardized as 1, and each of the light-outcoupling efficiencies is shown in a relative value.

As illustrated in FIG. 19, the light-outcoupling efficiencies with single transmission are almost same in the mirror surface structure and the low frequency removing structure, but with the multiple reflections taken into account, the light-outcoupling efficiency in the low frequency removing structure is quite higher than the light-outcoupling efficiency in the mirror surface structure. Since the organic EL element is generally provided with the reflective layer, a multiple reflection structure tends to be employed. Thus, it can be understood that the low frequency removing structure (the controlled random structure) is more advantageous.

Figure 20:
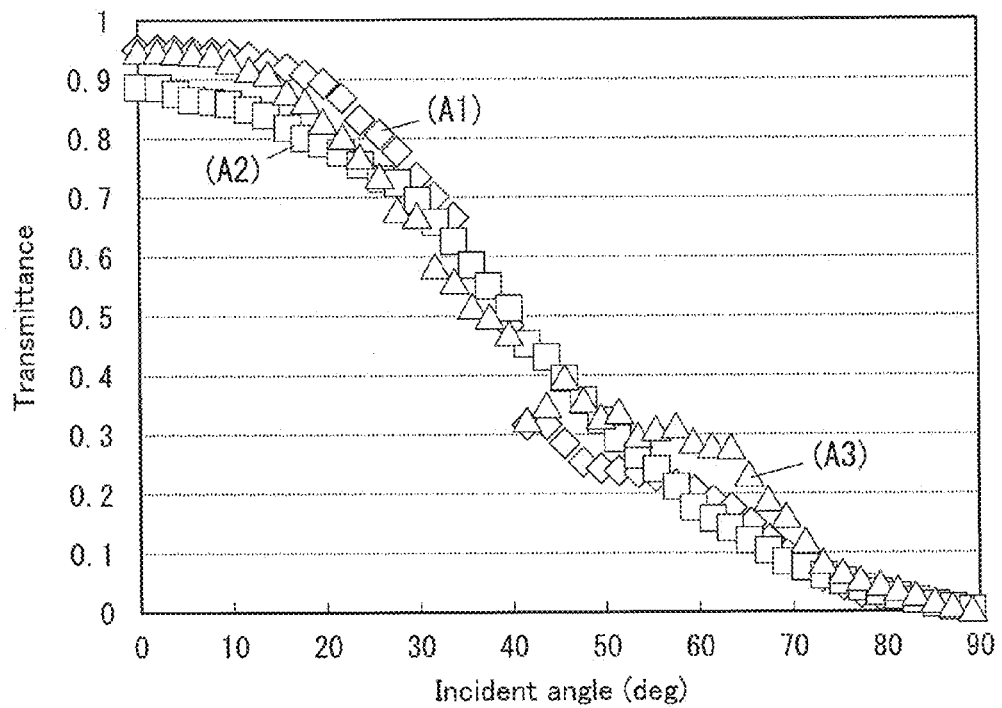
FIG. 20 is a graph illustrating a relationship between an incident angle and transmittance of light when uneven structures are varied

FIG. 20 is a graph illustrating a difference in the light transmittances depending on the uneven structure 20 in the at least one light-outcoupling structure 2. In FIG. 20, the incident angle of light is shown in the horizontal axis, and the light transmittance is shown in the vertical axis. In the graph illustrated in FIG. 20, the low frequency removing structure (the controlled random structure) is shown as (A1), the complete random structure is shown as (A2), and the diffraction structure (diffraction grating) is shown as (A3).

As for a simulation illustrated in FIG. 20, in the controlled random structure (A1) (the low frequency removing structure), the uneven sections are assumed to be sections in the hexagonal lattice, the height of the protrusions (or the recessions) is assumed to be 800 nm, and the average interval of the protrusions and the recessions is assumed to be 1800 nm. In the complete random structure (A2), the uneven sections are assumed to be sections in a square lattice, the height of the protrusions (or the recessions) is assumed to be 800 nm, and the average interval of the protrusions and the recessions is assumed to be 600 nm. In the diffraction grating (A3), the height of the protrusions (or the recessions) is assumed to be 600 nm, and the average interval of the protrusions and the recessions is assumed to be 1800 nm. These parameters are assumed as above so that overall transmittance is favorable with light with a wavelength of 550 nm.

As illustrated in FIG. 20, all of (A1) to (A3) have good light-outcoupling efficiencies at angles less than or equal to the critical angle. Thus the above described light-outcoupling structure 2 is considered to match well with a structure having the horizontally oriented dipoles. Especially out of these three structures (A1) to (A3), the low frequency removing structure (A1) in which randomness is controlled exhibits an excellent effect.

[Variation in Light-Outcoupling Structures]

Preferable examples and modified examples of the at least one light-outcoupling structure 2 are explained hereinafter.

It is preferable that the at least one light-outcoupling structure 2, has higher light transmittance for s-polarized light in incident light compared to light transmittance for p-polarized light in the incident light. As explained above, s-polarized component increases when the dipoles are horizontally oriented. Therefore, when the light transmittance of s-polarized light is greater than the light transmittance of p-polarized light, the at least one light-outcoupling structure 2 can extract more s-polarized light, leading to the high light-outcoupling efficiency.

Table 3 shows a ratio of s-polarized light to p-polarized light in light emitted from the light emitting layer 5 with oriented dipoles. The ratio can be determined by a calculation of a radiation model. As shown in Table 3, light emitted from the horizontally oriented dipole includes s-polarized light and p-polarized light in the ratio of 3:1. On the other hand, light emitted from the vertically oriented dipole only includes p-polarized light. Note that, in the random orientation, s-polarized light and p-polarized light are included in the ratio of 1:1. Accordingly, since more s-polarized light is included in the horizontally oriented dipole, the at least one light-outcoupling structure 2 with high transmittance for s-polarized light is advantageous. Note that, the transmittance for s-polarized light is defined as s-wave transmittance, and the transmittance for p-polarized light is defined as p-wave transmittance.

TABLE 3

| Polarized light | Random orientation | Vertical orientation | Horizontal orientation |
|---|---|---|---|
| s-polarized light | 0.5 | 0 | 0.75 |
| p-polarized light | 0.5 | 1 | 0.25 |
| Total | 1 | 1 | 1 |

The at least one light-outcoupling structure 2 in which the light transmittance of s-polarized light is larger than the light transmittance of p-polarized light can be achieved by selecting a material and a formation method of the at least one light-outcoupling structure 2. For example, the light transmittance of s-polarized light can be heightened than the light transmittance of p-polarized light in the at least one light-outcoupling structure 2 by forming the at least one light-outcoupling structure 2 with a serrated structure.

Figure 21:
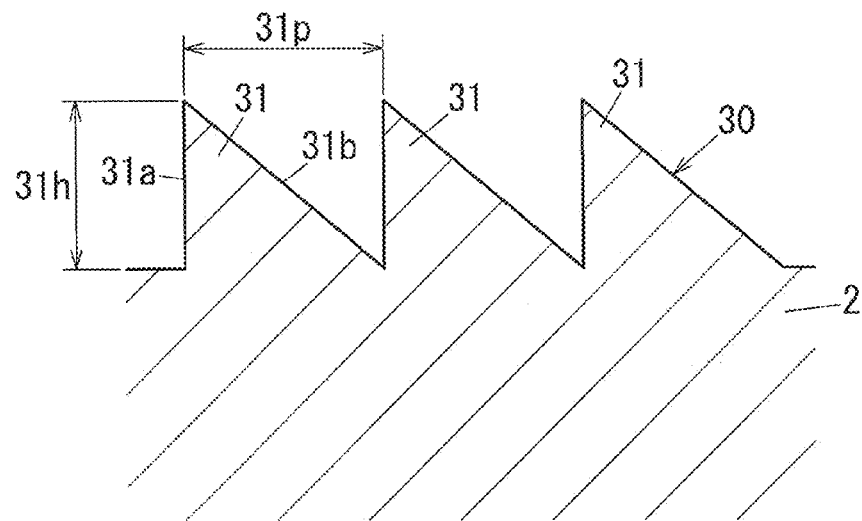
FIG. 21 is an explanatory view illustrating an example of a light-outcoupling structure having a serrated structure.

FIG. 21 is an explanatory view illustrating an example of the at least one light-outcoupling structure 2 with the serrated structure 30. In FIG. 21, a cross-sectional view of the serrated structure 30 is illustrated. The serrated structure 30 may be a structure having a shape like saw teeth. Serrated may mean having a zigzag shape. In FIG. 21, the serrated structure 30 is formed such that a protrusion 31 constituting the serrated structure 30 includes a vertically protruded part 31a with respect to a surface of a layer and an obliquely protruded part 31b with respect to the surface of the layer. A plurality of protrusions 31 having same heights (height 31h) are arranged at a predetermined pitch (pitch 31p). The pitch of the plurality of protrusions 31 may be within a range of 1 to 10 μm. The pitch of the plurality of protrusions 31 may be considered as a width of the protrusion 31. A height of the protrusion 31 may be within a range of 1 to 10 μm. The height and the pitch (width) of the protrusions 31 may be substantially same. For example, the at least one light-outcoupling structure 2 in which the light transmittance of s-polarized light is larger than the light transmittance of p-polarized light can be formed by arranging the plurality of protrusions 31 with the height of 1.5 μm at the pitch of 1.5 μm. Note that, an example illustrated in FIG. 21 is merely one example of the at least one light-outcoupling structure 2.

An embodiment in which the at least one light-outcoupling structure 2 is disposed between the light transmissive substrate 1 and the light emitting layer 5 is explained above, but the position of the at least one light-outcoupling structure 2 is not limited thereto.

Figure 22:
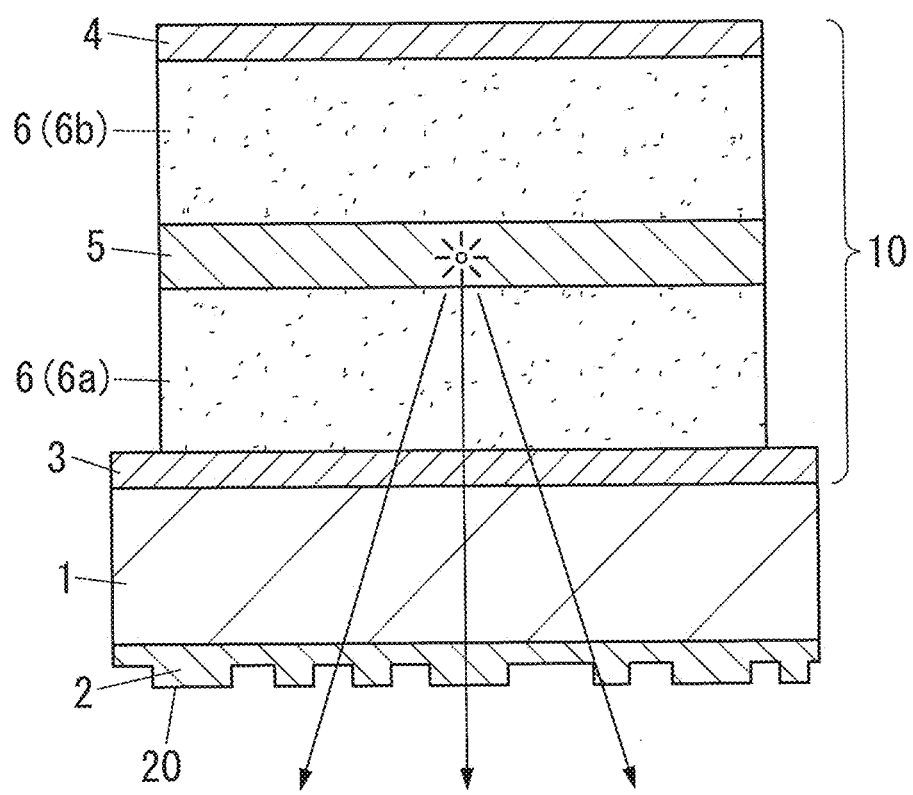
FIG. 22 is a schematic view illustrating an example of a layering structure of an organic electroluminescent element.

FIG. 22 illustrates another example of the layering structure of the organic EL element including the at least one light-outcoupling structure 2. In FIG. 22, the at least one light-outcoupling structure 2 is provided to an outer side of the light transmissive substrate 1. The at least one light-outcoupling structure 2 may be provided on the surface of the light transmissive substrate 1. The at least one light-outcoupling structure 2 provided to the outer side of the light transmissive substrate 1 can also enhance the light-outcoupling efficiency of light generated from the light emitting layer 5 with the horizontally oriented dipoles.

The at least one light-outcoupling structure 2 illustrated in FIG. 22 may be constituted by the transparent material layer as described above. Alternatively, the light transmissive substrate 1 itself may be provided with the uneven structure 20. In FIG. 22, the light-outcoupling structure 2 is formed with one layer without the covering layer.

The at least one light-outcoupling structure 2 provided to the outer side of the light transmissive substrate 1 may have a same structure as the at least one light-outcoupling structure 2 explained in FIG. 1. In this light-outcoupling structure 2, the uneven structure 20 preferably includes the plurality of protrusions 11 having substantially same heights which are individually allocated to some of the planar matrix-like sections so that the planar matrix-like sections become uneven, and the ratio of the area of one or more of the plurality of protrusions 11 in a unit region to the total area of the unit region is preferably substantially constant in each unit region with regard to unit regions consisting of same number of sections of the planar matrix-like sections. In a preferably example of the uneven structure 20, the uneven structure 20 has a structure in which the plurality of protrusions 11 and the plurality of recessions 12 are arranged randomly. In a preferably example of the uneven structure 20, the uneven structure 20 has a structure in which the plurality of protrusions 11 and the plurality of recessions 12 are arranged and has the average pitch of the plurality of protrusions 11 and the plurality of recessions 12 smaller than the average pitch of the plurality of protrusions 11 and the plurality or recessions 12 which are arranged randomly. In a preferably example of the uneven structure 20, the uneven structure 20 has a structure in which the plurality of protrusions 11 and the plurality of recessions 12 are arranged periodically. These examples may be same as the at least one light-outcoupling structure 2 explained above.

Figure 23:
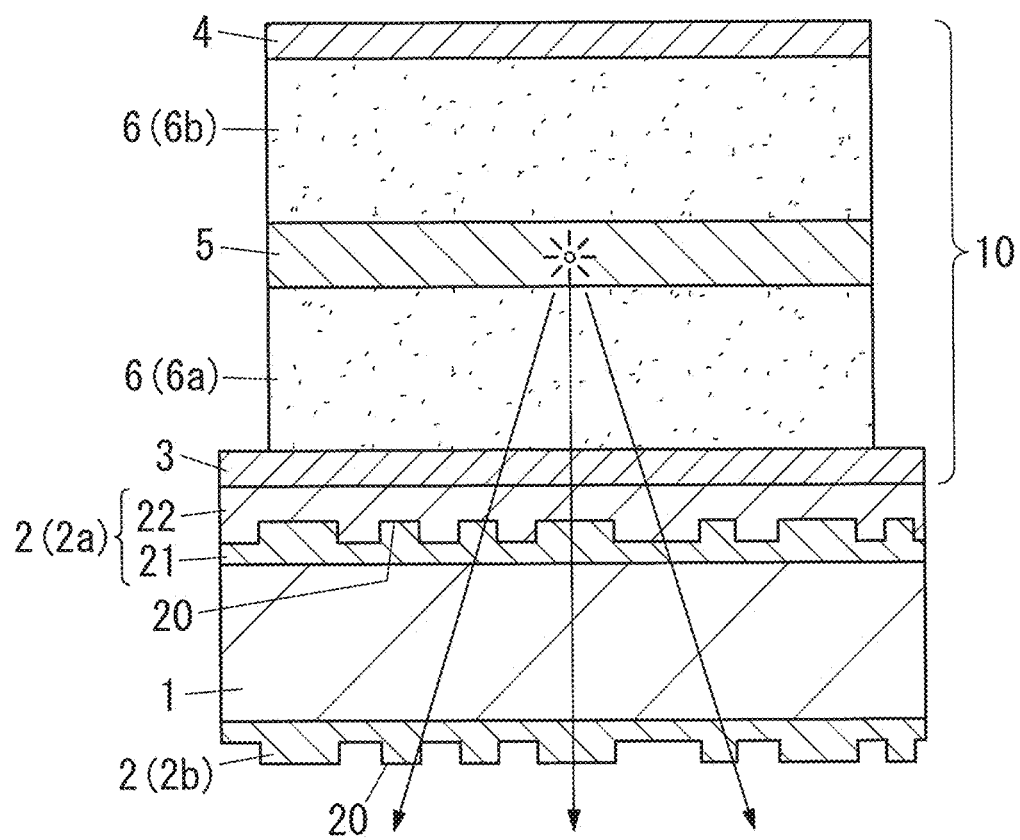
FIG. 23 is a schematic view illustrating an example of a layering structure of an organic electroluminescent element.

FIG. 23 is a diagram illustrating the layering structure of the organic EL element including a plurality of light-outcoupling structures 2.

The plurality of light-outcoupling structures 2 may be provided to the organic EL element. In a preferably example of the organic EL element, the organic EL element includes the plurality of light-outcoupling structures 2 in the direction perpendicular to the surface of the light transmissive substrate 1. When the organic EL element includes the plurality of light-outcoupling structures 2, the light-outcoupling efficiency can be further enhanced.

In FIG. 23, the plurality of light-outcoupling structures 2 is provided to both of the outer side and an inner side of the light transmissive substrate 1. The plurality of light-outcoupling structures 2 may be formed on the both surfaces of the light transmissive substrate 1. When the plurality of light-outcoupling structures 2 are formed on both of the outer side and the inner side of the light transmissive substrate 1, the light-outcoupling efficiency of light generated in the light emitting layer 5 with horizontally oriented dipoles can be further enhanced. The light-outcoupling structure 2 formed on the inner side is defined as a first light-outcoupling structure 2a. The light-outcoupling structure 2 formed on the outer side is defined as a second light-outcoupling structure 2b. The second light-outcoupling structure 2b may be referred to as an additional light-outcoupling structure.

The first light-outcoupling structure 2a may have a same structure as the aforementioned light-outcoupling structure 2 which is disposed between the first electrode 3 and the light transmissive substrate 1. The second light-outcoupling structure 2b may have a same structure as the light-outcoupling structure 2 explained in the embodiment of FIG. 22 which is disposed on the outer side of the light transmissive substrate 1.

Note that, in the embodiment of FIG. 23, both of the plurality of light-outcoupling structures 2 are the optical structures including the uneven structures 20 explained above. However, one of the plurality of light-outcoupling structures 2 may be another optical structure. For example, the second light-outcoupling structure 2b may be formed as a structure such as a light scattering layer including light scattering particles, an optical film, and an uneven structure formed without sectioning. Alternatively, the second light-outcoupling structure 2b may be formed by roughening the surface of the light-transmissive substrate 1.

[Variation of Substrate]

The light transmissive substrate 1 preferably has the birefringence property which exhibits a higher refractive index in the direction parallel to the surface of the light transmissive substrate 1 than a refractive index in the direction perpendicular to the surface of the light transmissive substrate 1. In this case, more light emitted from the light emitting layer 5 with the horizontally oriented dipoles can be extracted outside, leading to further improvement in the light-outcoupling efficiency.

For example, a resin substrate may be used as the light transmissive substrate 1 having the birefringence property. Resin which is extended in the horizontal direction when produced is especially preferred. Examples of the resin used as the resin substrate may include PEN (polyethylene naphthalate) and PET (polyethylene terephthalate) but not limited thereto. The substrate made of such resin is generally formed by extending the resin in the horizontal direction to improve optical properties, mechanical properties, or heat resistance. Such resin may have crystallinity. Therefore, the resin substrate tends to have an anisotropic refractive index. It can be also said that resin formed by rolling is preferable.

Figure 24A:
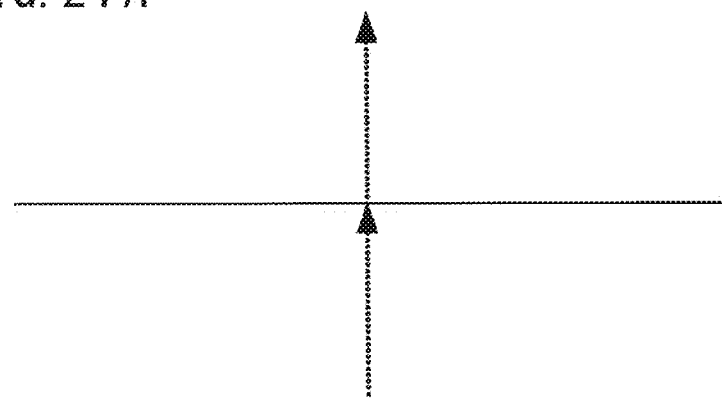
FIG. 24A, FIG. 24B and FIG. 24C are conceptual diagrams illustrating light entering a medium having a birefringent property.
Figure 24B:
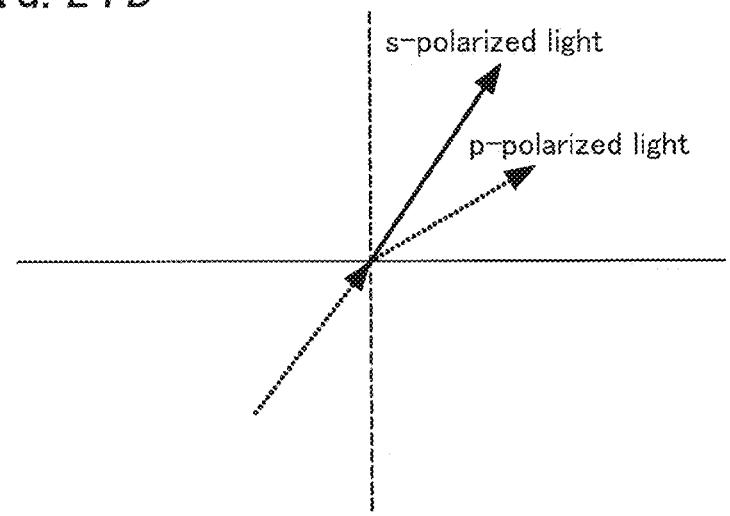
Figure 24C:
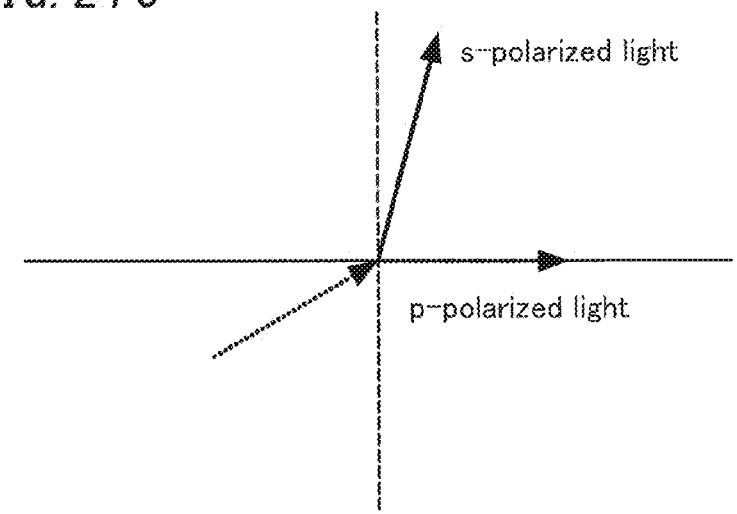

FIG. 24A, FIG. 24B, and FIG. 24C are explanatory views illustrating a behavior of light entering a medium having the birefringence property. FIG. 24A illustrates light traveling perpendicular to the medium. FIG. 24B illustrates light traveling obliquely against the medium with a relatively small incident angle. FIG. 24C illustrates light traveling obliquely against the medium with a relatively large incident angle. An interface between two media having the different refractive indices is the refractive index interface.

As shown in FIG. 24A, when light enters perpendicular to the refractive index interface, polarized components of light may be ignored. On the other hand, as shown in FIG. 24B and FIG. 24C, when light enters obliquely against the refractive index interface, s-polarized light and p-polarized light are important. In this regard, the medium having the birefringence property can exhibit a higher refractive index $n_{xy}$ in the direction along the xy plain than a refractive index $n_z$ in the direction along the z-axis, i.e., $n_{xy}>n_z$. In this case, according to Snell's law, s-polarized light tends to travel at smaller angles after entering the medium and be closer to the front direction. Therefore, depending on a case, a phenomenon may occur in which p-polarized light is totally reflected but s-polarized light enters the medium without totally reflected (see FIG. 24C). As described above, when the dipole is horizontally oriented, s-polarized light increases, and thus the birefringence property of the light transmissive substrate 1 can contribute to further enhancement of the light-outcoupling efficiency.

In a case where the light transmissive substrate 1 has the birefringence property, the refractive index $n_{xy}$ of the light transmissive substrate 1 in the direction parallel to the surface of the light transmissive substrate 1 may be, for example, within a range of 1.6 to 2.2. The refractive index $n_z$ of the light transmissive substrate 1 in the direction perpendicular to the surface of the light transmissive substrate 1 may be, for example, within a range of 1.5 to 2.0. When designing a light-outcoupling structure of the organic EL element, the refractive index $n_z$ of the light transmissive substrate 1 in the direction perpendicular to the surface of the light transmissive substrate 1 (in the thickness direction) may generally be used as the refractive index of the light transmissive substrate 1, since light traveling in the thickness direction contributes largely to light emission to outside. A difference between the refractive index $n_{xy}$ of the light transmissive substrate 1 in the direction parallel to the surface of the light transmissive substrate 1 and the refractive index $n_z$ of the light transmissive substrate 1 in the direction perpendicular to the surface of the light transmissive substrate 1 is preferably larger than or equal to 0.1, more preferably larger than or equal to 0.2, and further preferably larger than or equal to 0.3. The larger the difference in the refractive indices becomes, the further the light-outcoupling efficiency can be enhanced. A maximum difference between the refractive index $n_{xy}$ of the light transmissive substrate 1 in the direction parallel to the surface of the light transmissive substrate 1 and the refractive index $n_z$ of the light transmissive substrate 1 in the direction perpendicular to the surface of the light transmissive substrate 1 is not particularly limited, but the difference in the refractive indices may be, for example, less than or equal to 0.5 in terms of easiness in manufacturing. The refractive indices of the light transmissive substrate 1 may be values measured with spectroscopic ellipsometry. As a measuring device, a spectroscopic ellipsometer and the like may be used.

[Variation of Light Emitting Layer]

In the above, it is explained that at least one light emitting layer 5 preferably has the birefringence property. However, when the plurality of light emitting layers 5 is provided, at least one of the plurality of light emitting layers 5 preferably has the birefringence property. All of the plurality of light emitting layers 5 further preferably has the birefringence property.

Furthermore, the above structure may be applied to the organic EL element with a multi-unit structure. The multi-unit structure is a structure in which a plurality of light emitting units is provided. The light emitting unit is a structure which emits light when placed between the anode and the cathode. The light emitting unit includes one or more light emitting layers 5. In a case where the light emitting layer(s) 5 in the light emitting unit(s) has the birefringence property, the light-outcoupling efficiency can be improved.

[Materials of Organic EL Element]

The following explanations are to explain materials constituting the organic EL element and a method of formation of the layers. The organic EL element can be made of appropriate materials generally used for producing the organic EL element. A method of formation of the layering structure illustrated in FIG. 1 is used as an example to explain, but is applicable to other layering structures.

The light transmissive substrate 1 may be made of a substrate of glass. Such glass may be soda glass. Non-alkali glass may be used. However, soda glass is generally more inexpensive than non-alkali glass and is advantageous in terms of cost. Further, when the soda glass is used, the at least one light-outcoupling structure 2 serves as a foundation layer for the organic layer. Hence, it is possible to suppress effects of alkali diffusion on the first electrode 3 made of ITO or the like. As a matter of course, as described above, the light transmissive substrate 1 may be made of a substrate of resin. When the light transmissive substrate 1 is made of glass, the refractive index of the light transmissive substrate 1 may be, for example, within a range of 1.3 to 1.6.

The light-outcoupling structure 2 may be formed by stacking the first transparent material layer 21 and the second transparent material layer 22.

The light emitting stack 10 having a light emitting structure is formed on the at least one light-outcoupling structure 2. The light emitting stack 10 includes an organic layer, which includes the light emitting layer 5, provided between the first electrode 3 and the second electrode 4. In the present description, the organic layer is defined as a layer between the first electrode 3 and the second electrode 4. The organic layer may be constituted by a hole transport layer, the light emitting layer 5, an electron transport layer, and an electron injection layer, which are arranged in this order from the anode, for example. In the organic EL element, the first electrode 3 which is light transmissive may serve as the anode, and the second electrode 4 which is light reflective may serve as the cathode. Of course, the first electrode 3 may serve as the cathode, and the second electrode 4 may serve as the anode. A refractive index of the organic layer may be determined by adding up a value of each layer calculated by a refractive index of the each layer multiplied by a percentage of the thickness of the each layer in the total thickness of the organic layer. The refractive index of the organic layer is not particularly limited, but may be set, for example, within a range of 1.5 to 2.0.

A stack structure of the organic layer is not limited to the aforementioned example. For example, the organic layer may have a single layer structure of a light emitting layer, a stack structure of a hole transport layer, a light emitting layer, and an electron transport layer, a stack structure of a hole transport layer and a light emitting layer, and a stack structure of a light emitting layer and an electron transport layer. Further, a hole injection layer may be provided between the anode and the hole transport layer. Further, the light emitting layer may have a single layer structure or a multilayer structure. For example, when desired emission color is white, the light emitting layer may be doped with three types of dopant pigments of red, green, and blue. Alternatively, the light emitting layer may have a stack structure of a blue hole transport light emitting layer, a green electron transport light emitting layer, and a red electron transport light emitting layer, or a stack structure of a blue electron transport light emitting layer, a green electron transport light emitting layer, and a red electron transport light emitting layer. Further, a multi-unit structure may be used. In the multi-unit structure, a plurality of light emitting units are stacked with interlayers, which are light transmissive and conductive, in-between, and each light emitting unit is defined as an organic layer having a function of emitting light in response to application of voltage between an anode and a cathode. The multi-unit structure means a structure in which the plurality of light emitting units, which are stacked in the thickness direction and electrically connected in series with each other, are positioned between one anode and one cathode.

One of the first electrode 3 and the second electrode 4 serves as the anode and the other serves as the cathode. In a preferable example of the organic EL element, the first electrode 3 serves as the anode which is light transmissive and the second electrode 4 serves as the cathode which is light reflective. A refractive index of the first electrode 3 is not particularly limited, but may be, for example, within a range of 1.2 to 2.0.

The anode is an electrode for injecting holes. The anode may be preferably made of an electrode material with a large work function, such as metal, alloys, electrically conductive compounds, and mixtures thereof. Further, to avoid a situation where a difference between a work function of the material of the anode and the HOMO (Highest Occupied Molecular Orbital) level becomes excessively large, the work function of the material of the anode preferably is greater than or equal to 4 eV and less than or equal to 6 eV. The electrode material of the anode may be selected from, for example, metal oxides such as ITO, tin oxide, zinc oxide, and IZO, metal compounds such as copper iodide, conductive polymers such as PEDOT and polyaniline, conductive polymers doped with arbitrary acceptors, and conductive light transmissive materials such as carbon nanotube. In this regard, the anode may be a thin film formed on the surface of the at least one light-outcoupling structure 2 provided on the light transmissive substrate 1, by sputtering, vacuum deposition, or coating. Note that, a sheet resistance of the anode is preferably less than or equal to several hundred $\Omega/\square$, and more preferably is less than or equal to $100\Omega/\square$. Further, a thickness of the anode may be less than or equal to 500 nm, and may preferably be within a range of 10 nm to 200 nm. Light transmittance tends to increase with a decrease in the thickness of the anode, but the sheet resistance tends to increase with the decrease in the thickness. When the size of the organic EL element is increased, a high voltage may be required, and luminance uniformity may become poor (caused by non-uniformity of a current density distribution resulting from a drop in voltage). To avoid this trade-off, generally it is effective to form, on the light transmissive anode, an auxiliary electrode (grid) which is made of metal. Preferably, a material for the auxiliary electrode is excellent in electric conductivity, and may be selected from metals such as Ag, Cu, Au, Al, Rh, Ru, Ni, Mo, Cr, and Pd, and alloys of these metals such as MoAlMo, AlMo, and AgPdCu. In this case, to prevent such a metal grid from acting as a light blocking member, the surface of the grid part may be more preferably subjected to insulating treatment so as to block a current flow from the grid part to the cathode. Further, to minimize the effects of absorption of diffused light by the grid, it is preferable that metal used for the grid is as highly reflective as possible.

When the anode is formed by use of ITO, a film of ITO may be preferably formed at a temperature higher than or equal to 150° C. which causes crystallization of ITO. Alternatively, a film of ITO may preferably be formed at a low temperature and then subjected to annealing (higher than or equal to 150° C.). Crystallization causes an increase in conductivity, and therefore the aforementioned trade-off condition may be eased. In addition, the structure becomes dense, and therefore effects of suppressing outgas (such as water vapor), which occurs when the at least one light-outcoupling structure 2 is made of resin, from reaching the organic layer can be expected.

Examples of a material for the hole injection layer may include: hole injection organic materials or metal oxides; organic materials or inorganic materials used as materials for acceptors; and p-doped layers. An example of the hole injection organic materials is a material that can transport holes, has a work function of about 5.0 eV to 6.0 eV, and has strong adherence to the anode, such as CuPc and starburst amine. The hole injection metal oxides are, for example, metal oxides that include any of molybdenum, rhenium, tungsten, vanadium, zinc, indium, tin, gallium, titanium, and aluminum. Not only oxides of a single metal, but also composite metal oxides that include any one of metals described above, such as a set of indium and tin, a set of indium and zinc, a set of aluminum and gallium, a set of gallium and zinc, and a set of titanium and niobium may be used. The hole injection layers made of these materials may be formed by a dry process such as vapor deposition, a transfer method, or may be formed by a wet process such as spin coating, spray coating, dye coating, or gravure printing.

A material for the hole transport layer can be selected from, for example, a group of compounds that can transport holes. Examples of the compounds that can transport holes may include arylamine compounds such as 4,4'-bis[N-(naphthyl)-N-phenyl-amino]biphenyl (α-NPD), N,N'-bis(3-methylphenyl)-(1,1'-biphenyl)-4,4'-diamine (TPD), 2-TNATA, 4,4',4"-tris(N-(3-methylphenyl)N-phenylamino) triphenylamine (MTDATA), 4,4'-N,N'-dicarbazolebiphenyl (CBP), spiro-NPD, spiro-TPD, spiro-TAD, and TNB, amine compounds which contain a carbazole group, and amine compounds which contain fluorene derivatives. However, an arbitrary hole transport material that is generally known is available.

The light emitting layer 5 may be made of an appropriate material known as a material for the organic EL element. Examples of the material of the light emitting layer 5 may include anthracene, naphthalene, pyrene, tetracene, coronene, perylene, phthaloperylene, naphthaloperylene, diphenylbutadiene, tetraphenylbutadiene, coumalin, oxadiazole, bisbenzoxazoline, bisstyryl, cyclopentadiene, quinoline-metal complex, tris(8-hydroxyquinolinate)aluminum complex, tris(4-methyl-8-quinolinate)aluminum complex, tris(5-phenyl-8-quinolinate)aluminum complex, aminoquinoline-metal complex, benzoquinoline-metal complex, tri-(p-terphenyl-4-yl)amine, 1-aryl-2,5-di(2-thienyl)pyrrole derivative, pyrane, quinacridone, rubrene, distyrylbenzene derivative, distyrylarylene derivative, distyrylamine derivative, various fluorescent pigments, other materials containing one or more of the above materials, and the derivatives thereof, but are not limited to the aforementioned examples. Further, it is also preferable that light emitting materials selected from the above compounds are used in combination. In addition to compounds causing fluorescence represented by the aforementioned compounds, materials providing light emission due to spin multiplets, such as phosphorescent materials causing phosphorescence and compounds containing parts thereof in molecules may be used. Note that, the light emitting layer 5 made of the above materials may be formed by a dry process such as vapor deposition and a transfer method, or by a wet process such as spin coating, spray coating, dye coating, and gravure printing.

A material for the electron transport layer can be selected from a group of compounds that can transport electrons. Examples of the compounds that can transport electrons may include metal complexes known as electron transport materials such as Alga and heterocyclic compounds such as a phenanthroline derivative, a pyridine derivative, a tetrazine derivative, and an oxadiazole derivative, but are not limited to the aforementioned examples and may be an arbitrary electron transport material which is generally known.

A material for the electron injection layer may be arbitrarily selected from; for example, metal halides represented by metal fluorides such as lithium fluoride and magnesium fluoride and metal chlorides such as sodium chloride and magnesium chloride; metal oxides, metal nitrides, metal carbides, and metal oxynitrides of various metals such as aluminum, cobalt, zirconium, titanium, vanadium, niobium, chromium, tantalum, tungsten, manganese, molybdenum, ruthenium, iron, nickel, copper, gallium, zinc, and silicon, including, for example, compounds which can serve as insulators such as aluminum oxide, magnesium oxide, iron oxide, aluminum nitride, silicon nitride, silicon carbide, silicon oxynitride, and boron nitride; silicon compounds such as $SiO_2$ and SiO; and carbon compounds. These materials can be formed into a thin film by a method such as vacuum vapor deposition and sputtering.

The cathode is an electrode for injecting electrons into the light emitting layer. The cathode may preferably be made of an electrode material with a small work function, such as metals, alloys, electrically conductive compounds, and mixtures thereof. Further, to avoid a situation where a difference between a work function of the material of the cathode and the LUMO (Lowest Unoccupied Molecular Orbital) level becomes excessively large, the work function of the material of the cathode is preferably larger than or equal to 1.9 eV and less than or equal to 5 eV. Examples of the electrode material of the cathode may include, for example, aluminum, silver, magnesium, and alloys of one or more of these metals and other metal such as an amalgam of magnesium and silver, an amalgam of magnesium and indium, and an alloy of aluminum and lithium. Alternatively, as the electrode material of the cathode, a stack film in which an ultra-thin film (a thin film of a thickness less than or equal to 1 nm which allows flow of electrons due to tunnel injection) made of conductive metal materials, metal oxides, and mixtures of one or more of these and other metal, such as aluminum oxide and a thin film made of aluminum are stacked may be used.

When the organic EL element has the multi-unit structure, the interlayer is preferably provided between each of the plurality of light emitting units. The interlayer may function as an electric charge generating layer. The interlayer may be made of a material capable of generating electric charges to the corresponding light emitting unit. In order to extract light, the interlayer is preferably light transmissive. For example, the interlayer may be a metal thin film. The material of the interlayer may be exemplified by silver and aluminum. Alternatively, the interlayer may be made of organic materials.

In the organic EL element, the light emitting stack 10 is preferably enclosed by an enclosing material. Since the organic layer is susceptible to water, the organic layer side of the light transmissive substrate 1 is enclosed by use of a glass cap inside a dew-point controlled glove box (for example, the dew point is kept lower than or equal to −70° C.) to avoid contact with air. In this regard, when desiccant or the like are included inside the enclosed region, preservation lifetime can be further prolonged.

When the at least one light-outcoupling structure 2 is provided on a side of the light transmissive substrate 1 facing outside, the at least one light-outcoupling structure 2 may be formed as a film and a sheet. In this case, the at least one light-outcoupling structure 2 can be formed easily. For example, the at least one light-outcoupling structure 2 may be a diffusion film, a prism sheet, a micro lens sheet, or the like which is to be attached with an adhesive. In this case, by using a material which includes the uneven structure 20 as described above, the at least one light-outcoupling structure 2 capable of extracting more light from the light emitting layer 5 with the horizontally oriented dipoles can be obtained. Alternatively, the at least one light-outcoupling structure 2 may be obtained by direct processing such as blasting and etching on the light transmissive substrate 1.

Note that, the light emitting layer 5 is formed to have the birefringence property. The birefringence property of the light emitting layer 5 is provided by the horizontally oriented dipoles. The orientation of the dipoles do not need to be completely horizontal. It is preferable that the direction of dipole vibration is not perpendicular to the surface of the light transmissive substrate 1. The direction of dipole vibration is preferably at an angle larger than or equal to 45° and more preferably at an angle larger than or equal to 60°, with respect to the direction perpendicular to the surface of the light transmissive substrate 1. When the direction of dipole vibration is at an angle of 90°, the orientation of the dipole can be said to be completely horizontal.

The birefringence property in the light emitting layer 5 may be obtained by, for example, controlling a molecular structure in the light emitting layer 5. When controlling the molecular structure, a structure which facilitates the dipole orientation in a predetermined direction can be obtained. Accordingly, by employing a structure in which dipole moment is oriented in the horizontal direction, a desired molecular orientation can be achieved. For example, it is advantageous to control a molecular structure of a blue fluorescent dopant. For example, it is also advantageous to use a low molecular phosphorescent material. In addition, in a preferable example, TCTA:B3PYMAPM:Ir(ppy)$_2$(acac) is used as the material for the light emitting layer 5. By using this material, the light emitting layer 5 with the light emitting molecules oriented in the horizontal direction can be formed easily, leading to improvement in the light-outcoupling efficiency. Furthermore, techniques for orienting the molecules in the horizontal direction are known in areas such as organic single crystals, polymer films, and liquid crystals and such techniques may be employed. In the organic EL element, a coating method is preferably employed. When the coating method is used to form a film made of a polymeric material, the molecules can be relatively easily oriented in the desired direction by applying the film onto a rubbed substrate. The coating method can be employed easily in polymeric layers. The molecular orientation can also be achieved in low molecular layers. In this case, the molecules can be oriented in the desired direction by vapor deposition such as heating film deposition of the substrate. In short, the light emitting layer 5 should exhibit the birefringence property.

In the light emitting layer 5 having the birefringence property, it is preferable that the light emitting molecules at least have molecular orientation. In the light emitting layer 5 having the birefringence property, both of the light emitting molecules and the medium (host) may have molecular orientation. Accordingly, the light-outcoupling efficiency can be improved.

[Illumination Device and Display Device]

An illumination device can be produced using the aforementioned organic EL element. The illumination device includes the aforementioned organic EL element. Accordingly, the illumination device which has the high light-outcoupling efficiency and is power saving can be obtained. The illumination device may have a planar arrangement of a plurality of organic EL elements. The illumination device also may be a planar illumination body having one organic EL element. The illumination device may include a wiring structure to supply power to the organic EL element. The illumination device may include a body to support the organic EL element. The illumination device may include a plug to electrically connect the organic EL element to a power supply. The illumination device may be formed into a panel. Since a thickness of the illumination device can be made small, the illumination device which is space saving can be provided. The illumination device is especially useful as inspection lighting, since p-polarized light is reduced in the aforementioned organic EL element. This is because defects can be detected by scattering light.

Figure 25:
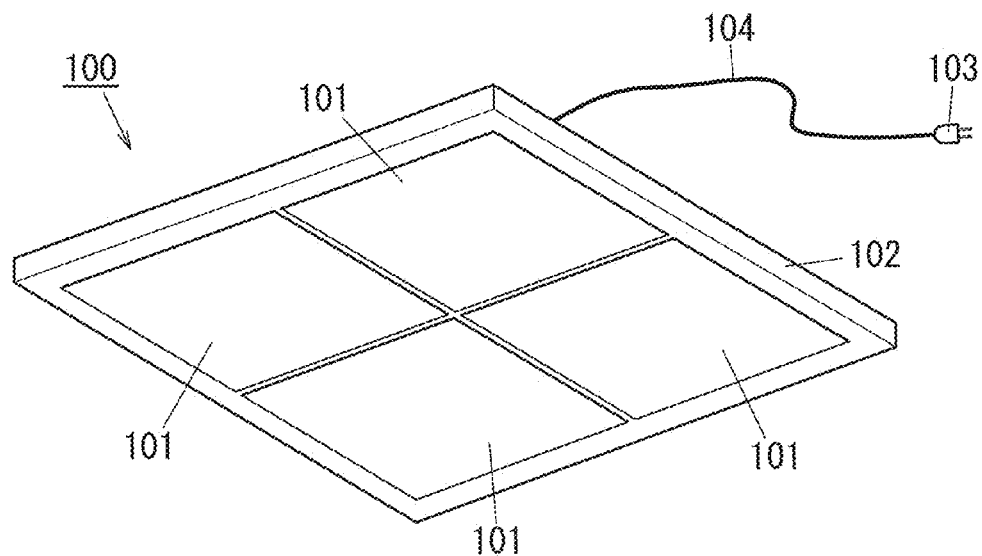
FIG. 25 is a schematic perspective view illustrating an example of an illumination device.

FIG. 25 illustrates an example of the illumination device. The illumination device 100 includes the organic EL elements 101, the body 102, the plug 103, and a wiring 104. In FIG. 25, the illumination device includes the planar arrangement of the plurality (four) of organic EL elements 101. The organic EL elements 101 are housed in the body 102. The organic EL elements 101 emit light upon receiving electric power through the plug 103 and the wiring 104, and thus light is emitted from the illumination device 100.

A display device can be produced using the aforementioned organic EL element. The display device includes the aforementioned organic EL element. Accordingly, the display device which has the high light-outcoupling efficiency and is power saving can be obtained. The display device may have a planar arrangement of a plurality of organic EL elements. The display device also may have a planar arrangement of one organic EL element. The display device may include a wiring structure to supply power to the organic EL element. The display device may include a body to support the organic EL element. The display device may include a plug to electrically connect the organic EL element to a power supply. The display device may be formed into a panel. Since a thickness of the display device can be made small, the display device which is space saving can be provided. The display device is especially useful as a back light for liquid crystal displays, since p-polarized light is reduced in the aforementioned organic EL element.

Figure 26:
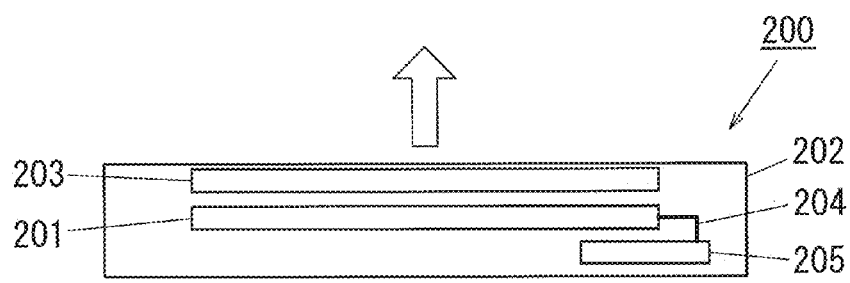
FIG. 26 is a schematic block diagram illustrating an example of a display device.

FIG. 26 illustrates an example of the display device. The display device 200 includes the organic EL element 201, the body 202, liquid crystals 203, a wiring 204, and an internal power supply 205. The organic EL element 201 is housed in the body 202 and provided underneath the liquid crystals. The organic EL element 201 functions as a back light for the liquid crystals 203. The organic EL element 201 is electrically connected to the internal power supply 205 through the wiring 204. The organic EL element 201 emits light upon receiving electric power from the internal power supply 205, and thus a liquid crystal display of the display device 200 becomes clear. In FIG. 26, light emission is illustrated with an outlined arrow.

The invention claimed is:

1. An organic electroluminescent element, comprising:
a light transmissive substrate;
a light emitting stack including a first electrode that is light transmissive, a light emitting layer, and a second electrode which are arranged in this order from the light transmissive substrate; and
at least one light-outcoupling structure which is provided closer to a light-outcoupling side, which is a side opposite the first electrode with respect to the light emitting layer, than the first electrode and has an uneven structure,
the light emitting layer having a birefringence property which exhibits a higher refractive index in a direction parallel to a surface of the light transmissive substrate than a refractive index in a direction perpendicular to the surface of the light transmissive substrate,
the uneven structure including a plurality of protrusions of substantially a same height which are allocated to first sections selected from planar grid-like sections so that the planar grid-like sections become uneven,
the uneven structure including
unit regions each of which corresponds to a total area of adjacent sections in a planar view, selected from the planar grid-like sections,
each of the unit regions including the same number of adjacent sections,
the adjacent sections including at least one section selected from the first sections, so that each of the unit regions includes at least one protrusion selected from the plurality of protrusions on the first sections, and
an area of the at least one protrusion in each of the unit regions being substantially a same in a planar view.

2. The organic electroluminescent element according to claim 1, wherein the uneven structure has a structure in which the plurality of protrusions and a plurality of recessions are randomly provided.

3. The organic electroluminescent element according to claim 1, wherein:
the uneven structure has a structure in which the plurality of protrusions and a plurality of recessions are provided, and
the uneven structure has an average pitch of the plurality of protrusions and the plurality of recessions smaller than an average pitch of the plurality of protrusions and the plurality of recessions which are randomly arranged.

4. The organic electroluminescent element according to claim 1, wherein
the uneven structure has a structure in which the plurality of protrusions and a plurality of recessions are arranged periodically.

5. The organic electroluminescent element according to claim 1, including
a plurality of light-outcoupling structures in the direction perpendicular to the surface of the light transmissive substrate.

6. The organic electroluminescent element according to claim 1, wherein
the at least one light-outcoupling structure has higher light transmittance for s-polarized light in incident light compared to light transmittance for p-polarized light in the incident light.

7. The organic electroluminescent element according to claim 1, wherein
the light transmissive substrate has a birefringence property which exhibits a higher refractive index in the direction parallel to the surface of the light transmissive substrate than a refractive index in the direction perpendicular to the surface of the light transmissive substrate.

8. An illumination device comprising:
the organic electroluminescent element according to claim 1; and
a wiring, the wiring supplying electric power to the organic electroluminescent element.

9. A display device comprising:
the organic electroluminescent element according to claim 1; and
a wiring, the wiring supplying electric power to the organic electroluminescent element.

10. The organic electroluminescent element according to claim 1, wherein
the planar grid-like sections comprise matrix-like sections.

11. The organic electroluminescent element according to claim 1, wherein
the planar grid-like sections comprise honeycomb-like sections.

12. The organic electroluminescent element according to claim 1, wherein
the uneven structure comprises a structure in which the plurality of protrusions are arranged aperiodically, and
a plurality of adjacent protrusions selected from the plurality of protrusions are arranged continuously with no more than predetermined number in one direction.

13. The organic electroluminescent element according to claim 12, wherein the uneven structure has an average pitch of the plurality of protrusions which is smaller than an average pitch of the plurality of adjacent protrusions.

* * * * *